US009887337B2

(12) United States Patent
Yoneda et al.

(10) Patent No.: US 9,887,337 B2
(45) Date of Patent: Feb. 6, 2018

(54) MANUFACTURING METHOD OF LIGHT EMITTING DEVICE

(71) Applicant: NICHIA CORPORATION, Anan-shi (JP)

(72) Inventors: Akinori Yoneda, Anan (JP); Yoshiyuki Aihara, Tokushima (JP); Shinji Nakamura, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/641,231

(22) Filed: Jul. 4, 2017

(65) Prior Publication Data
US 2017/0301844 A1 Oct. 19, 2017

Related U.S. Application Data

(62) Division of application No. 14/683,164, filed on Apr. 10, 2015, now Pat. No. 9,728,694.

(30) Foreign Application Priority Data

Apr. 10, 2014 (JP) .................. 2014-081158

(51) Int. Cl.
H01L 33/62 (2010.01)
H01L 33/00 (2010.01)
H01L 33/54 (2010.01)

(52) U.S. Cl.
CPC .......... H01L 33/62 (2013.01); H01L 33/0095 (2013.01); H01L 33/54 (2013.01); H01L 2933/0033 (2013.01)

(58) Field of Classification Search
None
See application file for complete search history.

(56) References Cited

U.S. PATENT DOCUMENTS

2007/0278664 A1 12/2007 Carney et al.
2010/0148198 A1 6/2010 Sugizaki et al.
(Continued)

FOREIGN PATENT DOCUMENTS

JP 5-299530 11/1993
JP 10-190062 7/1998
(Continued)

OTHER PUBLICATIONS

Ex Parte Quayle Action with Form PTO-892 Notice of References Cited issued by the U.S. Patent and Trademark Office for the parent U.S. Appl. No. 14/683,164, dated Mar. 23, 2017.
(Continued)

Primary Examiner — Jack Chen
(74) Attorney, Agent, or Firm — Mori & Ward, LLP

(57) ABSTRACT

A manufacturing method of a light emitting device includes preparing a wafer that is provided by arranging a plurality of semiconductor light emitting elements including semiconductor stacks and electrodes provided on first surfaces of the semiconductor stacks. A metal wire is wired in an arc shape between the electrodes of the plurality of semiconductor light emitting elements that are arranged in one direction on the wafer so as to connect each of the electrodes and the metal wire. A resin layer is provided on a side of the first surfaces of the semiconductor stacks in such a way that the metal wire is accommodated inside the resin layer. The wafer is cut along a boundary line to segment the plurality of semiconductor light emitting elements so as to singulate the plurality of semiconductor light emitting elements.

12 Claims, 29 Drawing Sheets

(56) References Cited

U.S. PATENT DOCUMENTS

2012/0241792 A1    9/2012  Obata et al.
2014/0319567 A1   10/2014  Yoneda et al.
2015/0295152 A1*  10/2015  Yoneda ............... H01L 33/0095
                                                           257/98

FOREIGN PATENT DOCUMENTS

| JP | 2003-282957 | 10/2003 |
| JP | 2008-251794 | 10/2008 |
| JP | 2010-141176 | 6/2010 |
| JP | 2012-134421 | 7/2012 |
| JP | 2012-212871 | 11/2012 |
| JP | 2014-225644 | 12/2014 |
| WO | WO 2006/068642 | 6/2006 |

OTHER PUBLICATIONS

Notice of Allowance Issued by the United States Patent and Trademark Office for the parent U.S. Appl. No. 14/683,164, dated Apr. 25, 2017.

\* cited by examiner

MANUFACTURING METHOD OF LIGHT EMITTING DEVICE

CROSS-REFERENCE TO RELATED APPLICATIONS

The present application is a divisional application of the U.S. patent application Ser. No. 14/683,164 filed Apr. 10, 2015, which claims priority under 35 U.S.C. § 119 to Japanese Patent Application No. 2014-081158, filed Apr. 10, 2014. The contents of this application are incorporated herein by reference in their entirety.

BACKGROUND OF THE INVENTION

(1) Field of the Invention

The present invention relates to a manufacturing method of a light emitting device.

(2) Description of the Related Art

A light emitting device that employs a semiconductor light emitting element (light emitting element) such as a light emitting diode is widely used because it can easily be miniaturized and also due to its high luminous efficiency. A light emitting device that employs a light emitting element may be roughly divided into two types, namely, a face-up type according to which the surface of the light emitting element where a pad electrode is to be provided is on the opposite side from the mounting substrate, and a face-down type according to which an electrode is provided on the lower surface of the light emitting element which is a surface facing the mounting substrate.

According to the face-up type, the light emitting element is mounted on a lead or the like, and the light emitting element and the lead are connected by a bonding wire or the like. Accordingly, when mounted on the mounting substrate and viewed in a plan view in a direction perpendicular to the surface of the substrate, a part of the bonding wire has to be positioned on the outside than the light emitting element, and thus there may be a limit on miniaturization.

On the other hand, with the face-down type (flip-chip type), a pad electrode provided on a surface of the light emitting element and wiring provided on the mounting substrate may be electrically connected by a connection part such as a bump or a metal pillar positioned within the range of the size of the light emitting element when viewed in plan view in a direction perpendicular to the surface of the mounting substrate. Therefore, a CSP (Chip Size Package or Chip Scale Package) may be realized where the size of the light emitting device (especially the size in plan view when viewed in a direction perpendicular to the mounting substrate) is miniaturized to a size close to that of the chip of the light emitting element.

Furthermore, in recent years, for further miniaturization or further increased luminous efficiency, a face-down light emitting device from which a growth substrate (light-transmissive substrate) of sapphire or the like is removed or the thickness thereof is reduced is used.

A growth substrate is a substrate used for growing thereon an n-type semiconductor layer and a p-type semiconductor layer for forming a light emitting element, and has an effect of increasing the strength of a light emitting device by supporting the light emitting element that is thin and has low strength. Accordingly, with a light emitting device whose growth substrate is removed or whose growth substrate is reduced in thickness after a light emitting element is formed, a resin layer is provided on the electrode side (side facing a mounting substrate) to support the light emitting element, and also a metal pillar penetrating the resin layer is formed, and the electrode of the light emitting element and wiring (wiring layer) provided to the mounting substrate are electrically connected by this metal pillar, as indicated in Japanese Unexamined Patent Application Publication No. 2010-141176 (hereinafter referred to as Patent Document 1), for example. With the resin layer including this metal pillar, the light emitting device may secure sufficient strength.

On the other hand, for example, Japanese Unexamined Patent Application Publication No. 5-299530 (hereinafter referred to as Patent Document 2) and Japanese Unexamined Patent Application Publication No. 2008-251794 (hereinafter referred to as Patent Document 3) disclose, although not with respect to a light emitting element, methods of connecting, by a metal wire, wiring on a mounting substrate and a terminal provided on the surface of a resin for external connection.

SUMMARY OF THE INVENTION

According to one aspect of the present invention, a manufacturing method of a light emitting device includes preparing a wafer that is provided by arranging a plurality of semiconductor light emitting elements including semiconductor stacks and electrodes provided on first surfaces of the semiconductor stacks. A metal wire is wired in an arc shape between the electrodes of the plurality of semiconductor light emitting elements that are arranged in one direction on the wafer so as to connect each of the electrodes and the metal wire. A resin layer is provided on a side of the first surfaces of the semiconductor stacks in such a way that the metal wire is accommodated inside the resin layer. The wafer is cut along a boundary line to segment the plurality of semiconductor light emitting elements so as to singulate the plurality of semiconductor light emitting elements.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A and 2B are schematic views showing the structure of the light emitting device according to the first embodiment of the present invention, in which FIG. 2A is a plan view, and FIG. 2B is a cross-sectional view along line A-A in FIG. 2A;

FIGS. 3A and 3B are schematic views showing the structure of the light emitting device according to the first embodiment of the present invention, in which FIG. 3A is a cross-sectional view along line B-B in FIG. 2A, and FIG. 3B is a cross-sectional view along line C-C in FIG. 2A;

FIGS. 4A and 4B are schematic views showing an example of the structure of the light emitting element according to the first embodiment of the present invention, in which FIG. 4A is a plan view, and FIG. 4B is a cross-sectional view along line A-A in FIG. 4A;

FIGS. 5A and 5B are schematic views showing an example of the structure of the light emitting element according to the first embodiment of the present invention, in which FIG. 5A is a cross-sectional view along line B-B in FIG. 4A, and FIG. 5B is a cross-sectional view along line C-C in FIG. 4A;

FIGS. 6A to 6D are schematic cross-sectional views showing side-view mounting of light emitting devices according to the embodiment of the present invention and reference examples, in which FIG. 6A shows the light emitting device according to the embodiment of the present invention, and FIGS. 6B to 6D show the light emitting devices according to the reference examples;

FIGS. 8A to 8D are schematic views showing a light emitting element preparation step in manufacturing steps for the light emitting device according to the first embodiment of the present invention, in which FIG. 8A is a plan view, FIG. 8B is a cross-sectional view along line A-A in FIG. 8A, FIG. 8C is a cross-sectional view along line B-B in FIG. 8A, and FIG. 8D is a cross-sectional view along line C-C in FIG. 8A;

FIGS. 9A to 9D are schematic views showing a metal layer forming step in the manufacturing steps for the light emitting device according to the first embodiment of the present invention, in which FIG. 9A is a plan view, FIG. 9B is a cross-sectional view along line A-A in FIG. 9A, FIG. 9C is a cross-sectional view along line B-B in FIG. 9A, and FIG. 9D is a cross-sectional view along line C-C in FIG. 9A;

FIGS. 10A to 10D are schematic views showing a wire wiring step in the manufacturing steps for the light emitting device according to the first embodiment of the present invention, in which FIG. 10A is a plan view, FIG. 10B is a cross-sectional view along line A-A in FIG. 10A, FIG. 10C is a cross-sectional view along line B-B in FIG. 10A, and FIG. 10D is a cross-sectional view along line C-C in FIG. 10A;

FIGS. 12A and 12B are schematic views showing a resin layer forming step in the manufacturing steps for the light emitting device according to the first embodiment of the present invention, in which FIG. 12A is a cross-sectional view of a portion corresponding to line A-A in FIG. 10A, and FIG. 12B is a cross-sectional view of a portion corresponding to line B-B in FIG. 10A;

FIGS. 13A and 13B are schematic views showing a surface machining step in the manufacturing steps for the light emitting device according to the first embodiment of the present invention, in which FIG. 13A is a cross-sectional view of a portion corresponding to line A-A in FIG. 10A, and FIG. 13B is a cross-sectional view of a portion corresponding to line B-B in FIG. 10A;

FIGS. 14A to 14C are schematic views showing a half-dicing step in the manufacturing steps for the light emitting device according to the first embodiment of the present invention, in which FIG. 14A is a plan view, FIG. 14B is a cross-sectional view along line A-A in FIG. 14A, and FIG. 14C is a cross-sectional view along line B-B in FIG. 14A;

FIGS. 15A and 15B are schematic views showing an external connection electrode forming step in the manufacturing steps for the light emitting device according to the first embodiment of the present invention, in which FIG. 15A is a cross-sectional view of a portion corresponding to line A-A in FIG. 14A, and FIG. 15B is a cross-sectional view of a portion corresponding to line B-B in FIG. 14A;

FIGS. 18A and 18B are schematic views showing a singulation process in the manufacturing steps for the light emitting device according to the first embodiment of the present invention, in which FIG. 18A is a cross-sectional view of a portion corresponding to line A-A in FIG. 14A, and FIG. 18B is a cross-sectional view of a portion corresponding to line B-B in FIG. 14A;

FIGS. 20A and 20B are schematic views showing the structure of the light emitting device according to the second embodiment of the present invention, in which FIG. 20A is a cross-sectional view along line A-A in FIG. 19, and FIG. 20B is a cross-sectional view along line B-B in FIG. 19;

FIGS. 22A and 22B are schematic views showing the structure of the light emitting device according to the third embodiment of the present invention, in which FIG. 22A is a cross-sectional view along line A-A in FIG. 21, and FIG. 22B is a cross-sectional view along line B-B in FIG. 21;

FIGS. 24A and 24B are schematic views showing the structure of the light emitting device according to the fourth embodiment of the present invention, in which FIG. 24A is a cross-sectional view along line A-A in FIG. 23, and FIG. 24B is a cross-sectional view along line B-B in FIG. 23;

FIGS. 26A and 26B are schematic views showing the structure of the light emitting device according to the fifth embodiment of the present invention, in which FIG. 26A is a cross-sectional view along line A-A in FIG. 25, and FIG. 26B is a cross-sectional view along line B-B in FIG. 25;

FIGS. 28A and 28B are schematic views showing the structure of the light emitting device according to the sixth embodiment of the present invention, in which FIG. 28A is a cross-sectional view along line A-A in FIG. 27, and FIG. 28B is a cross-sectional view along line B-B in FIG. 27;

FIGS. 30A and 30B are schematic views showing the structure of the light emitting device according to the seventh embodiment of the present invention, in which FIG. 30A is a cross-sectional view along line A-A in FIG. 29, and FIG. 30B is a cross-sectional view along line B-B in FIG. 29.

DESCRIPTION OF THE EMBODIMENTS

Figure 1:
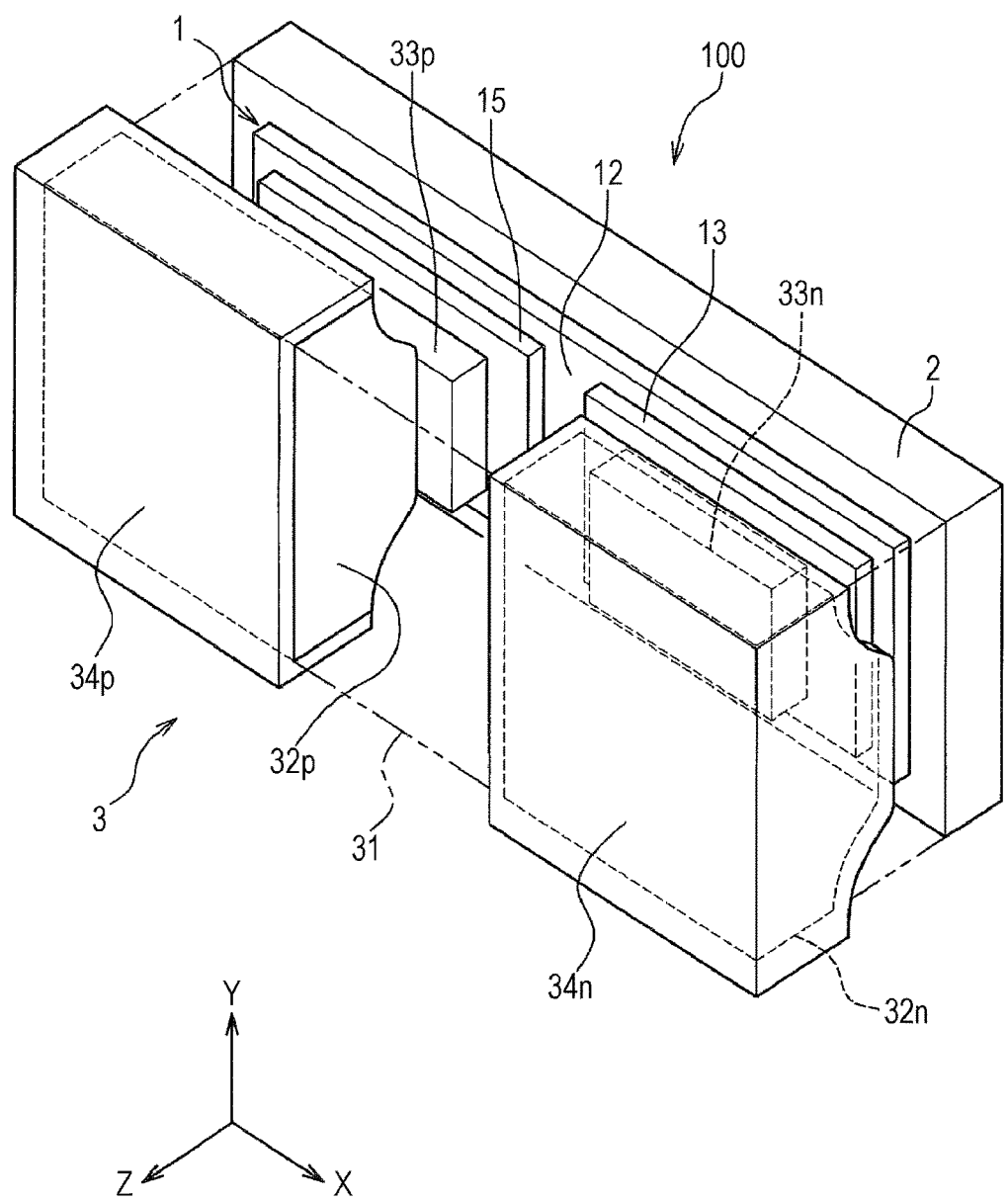
FIG. 1 is a schematic perspective view showing a structure of a light emitting device according to a first embodiment of the present invention.

The embodiments will now be described with reference to the accompanying drawings, wherein like reference numerals designate corresponding or identical elements throughout the various drawings.

Hereinafter, embodiments of a light emitting device according to the present disclosure and a manufacturing method thereof will be described. The drawings referred to in the description below schematically show the present disclosure, and the scales, the gap, the positional relationship and the like of the members may be exaggerated, or some of the members may be omitted. Also, the scales and the gap of the members may not coincide among the perspective view, the plan view and the cross-sectional view. Also, in the following description, the same name and the same reference sign basically refer to the same member or a member of the same material, and detailed description is omitted as appropriate.

Also, "above", "below", "left", "right" and the like of the light emitting device according to each embodiment of the present invention may change depending on the situation. In the present specification, "above", "below" and the like indicate the relative positions of the structural elements in the drawings referred to in the description, and are not intended to indicate the absolute positions unless particularly stated.

First Embodiment

Structure of Light Emitting Device

First, a structure of a light emitting device according to a first embodiment will be described with reference to FIG. 1 to FIG. 3B. As shown in FIG. 1 to FIG. 3B, a light emitting device 100 according to the first embodiment is a CSP which has a substantially cuboid outer shape, and which includes a semiconductor light emitting element 1 (hereinafter referred to a "light emitting element" as appropriate) having an LED (light emitting diode) structure from which a growth substrate is removed, a supporting member 3 provided on one surface side of the light emitting element 1, and a phosphor layer (wavelength conversion layer) 2 provided on the other surface side of the light emitting element 1. An n-side electrode 13 and a p-side electrode 15 are provided to one surface side of the light emitting element 1, and are electrically connected, via a metal layer (n-side metal layer) 33n and a metal layer (p-side metal layer) 33p and a metal wire (n-side metal wire) 32n and a metal wire (p-side metal wire) 32p, which are internal wiring provided inside a resin layer 31, which is a main material of the supporting member 3, to an external connection electrode (n-side external connection electrode) 34n and an external connection electrode (p-side external connection electrode) 34p, respectively, provided to cover the side surfaces and the upper surface of the resin layer 31.

Additionally, to show the internal structure in an easily understandable manner, the perspective view shown in FIG. 1 shows a see-through view of the resin layer 31 with the outer form of the resin layer 31 indicated by a double-dashed line. Also, in FIG. 1, description of a step portion 31g (see FIG. 2B, and FIGS. 3A and 3B) described later with respect to a lower portion (−Z axis direction) of the resin layer 31 is omitted. Also, the same thing may be said with respect to the perspective views of light emitting devices according to second to seventh embodiments shown in FIGS. 19A to 29A as with the perspective view shown in FIG. 1.

Figure 2A:
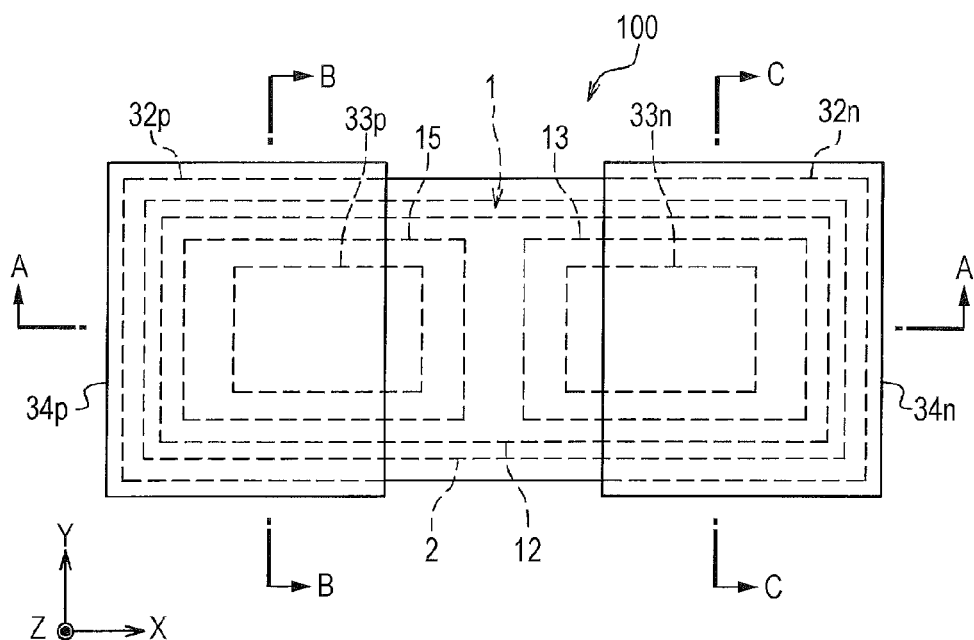
Figure 2B:
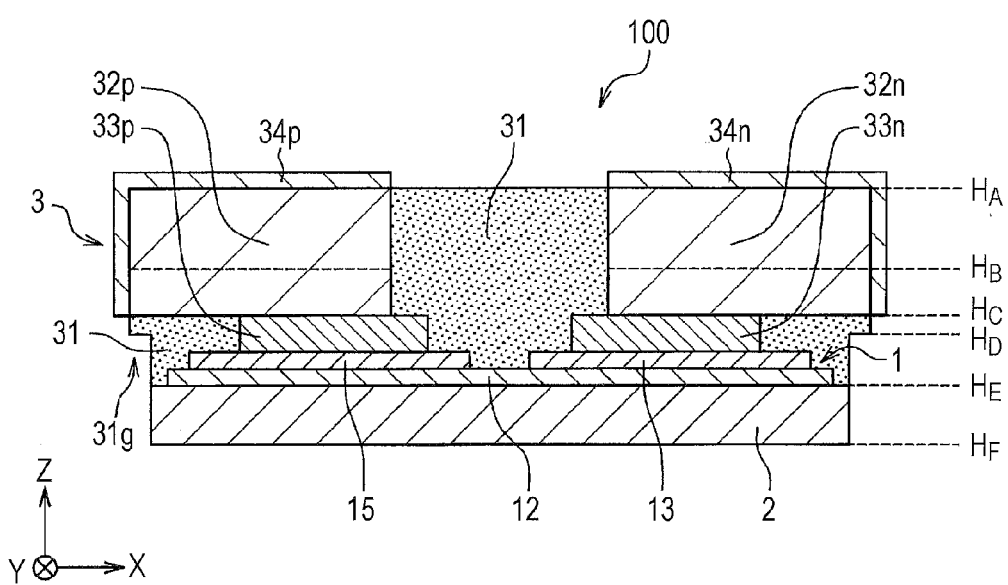
Figure 3A:
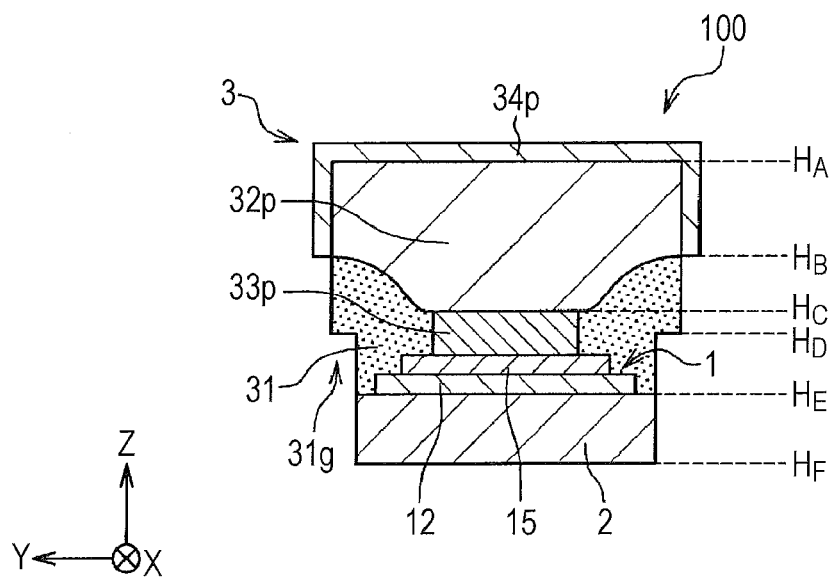
Figure 3B:
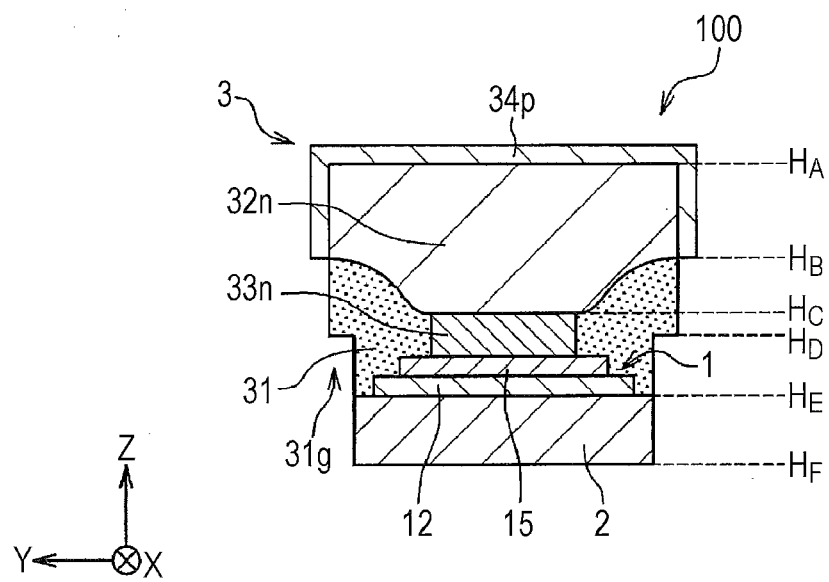
Figure 4A:
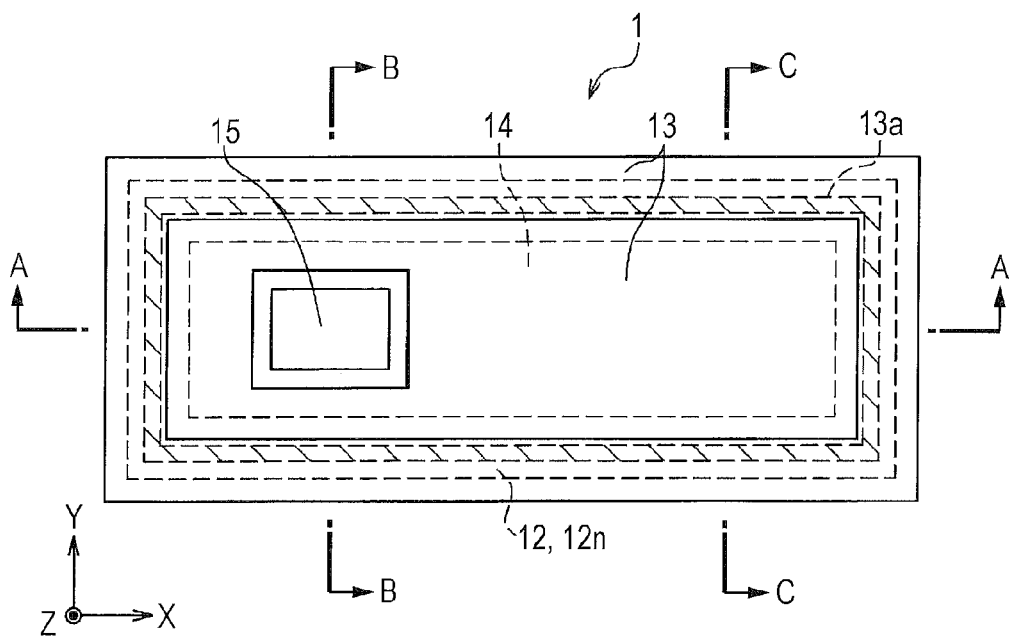
Figure 4B:
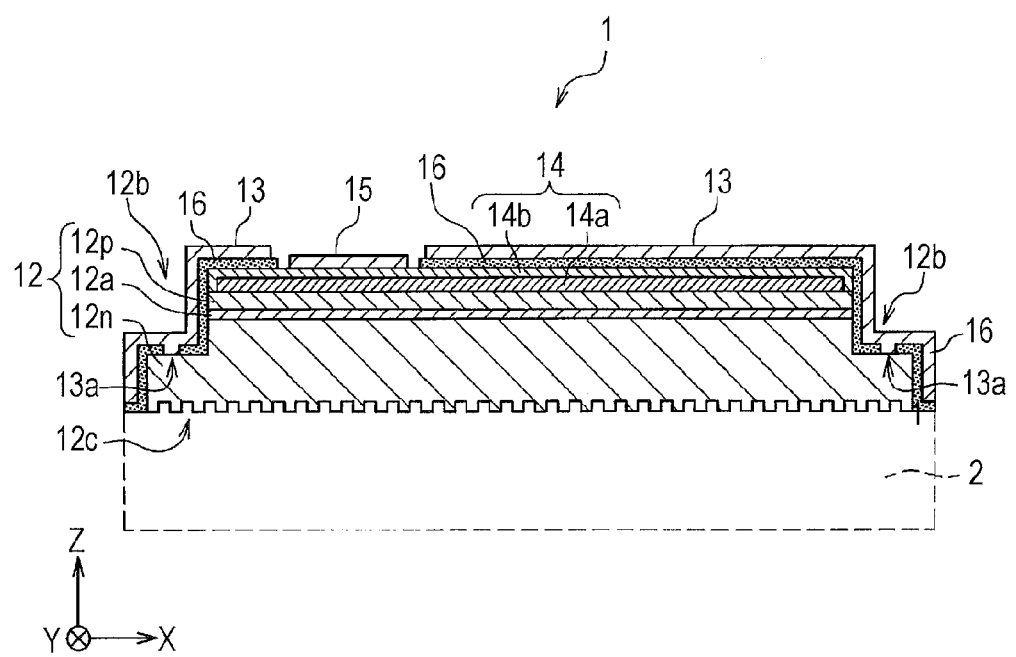
Figure 5A:
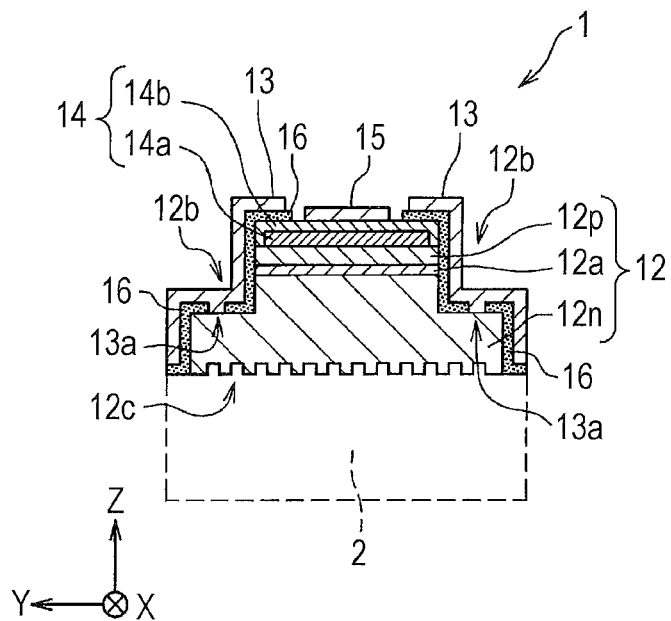
Figure 5B:
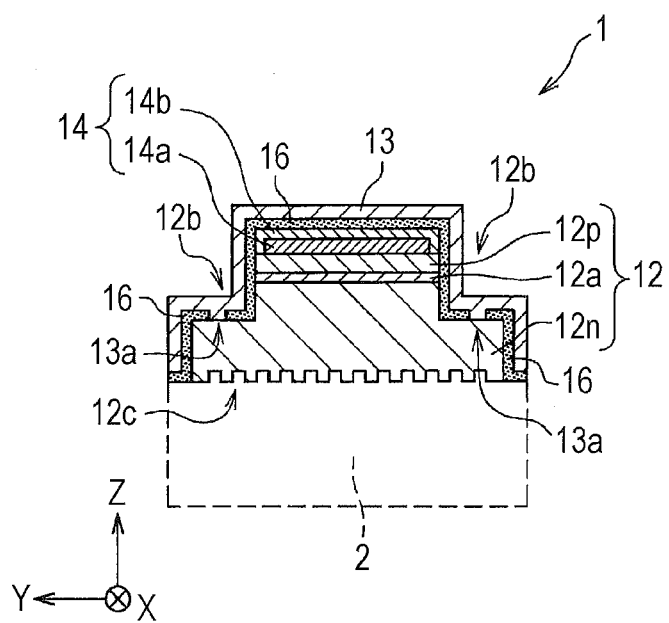

The light emitting device 100 is structured in such a way as to allow side-view mounting with one of the side surfaces in the longitudinal direction (a side surface parallel to the XZ plane) along which the external connection electrodes 34n and 34p are provided as the mounting surface, and to allow top-view mounting with the upper surface (a side surface parallel to the XY plane) as the mounting surface. Also, as shown in FIG. 2B, and FIGS. 3A and 3B, the step portion 31g is provided on a side surface in the lateral direction (a side surface parallel to the YZ plane) and a side surface in the longitudinal direction of the light emitting device 100, with a position $H_D$ in the height direction (Z-axis direction) as the boundary. The lower side surface below the position $H_D$ is formed to be on the inner side, in plan view, than the upper side surface above the position $H_D$. Additionally, as will be described later in detail, the light emitting device 100 is a WCSP (a CSP by a wafer process) which is fabricated at a wafer level.

Also, the light emitting device 100 converts, by a phosphor layer 2, a part or all of light emitted by the light emitting element 1 into light of a different wavelength, and takes, as output light, the light after wavelength conversion or the light after wavelength conversion and the light emitted by the light emitting element 1. For example, with the light emitting element 1 emitting blue light and the phosphor layer 2 absorbing a part of the blue light and performing wavelength conversion into yellow light, the light emitting device 100 can be a white light source that outputs white light which is a mixture of blue light and yellow light. Additionally, in the present embodiment and other embodiments described later, the light emitting device 100 and the like include the phosphor layer 2, but the phosphor layer 2 is not indispensable in forming the CSP, and may be omitted.

Additionally, for the sake of convenience, in the present specification, as shown by coordinate axes drawn in each drawing as appropriate, the normal direction of the surface where the n-side electrode 13 and the p-side electrode 15 of the light emitting element 1 are provided is taken as the "+Z-axis direction", and observation from the +Z-axis direction to the −Z-axis direction is referred to as "in plan view". Also, the longitudinal direction of the light emitting element 1 having a rectangular shape in plan view is referred to as the X-axis direction, and the lateral direction as the Y-axis direction. Moreover, each drawing shown as a cross-sectional view shows a cross-section of a surface perpendicular to the XY plane (that is, a plane parallel to the XZ plane or the YZ plane).

Next, the structure of each section of the light emitting device 100 will be described one by one in detail. The light emitting element 1 is a face-down LED chip having a substantially rectangular plate shape in plan view, and including the n-side electrode 13 and the p-side electrode 15 on one surface side.

Example of Light Emitting Element

Here, with reference to FIGS. 4A and 4B and FIGS. 5A and 5B, an example of the light emitting element 1 will be described in detail. The light emitting element 1 shown in FIGS. 4A and 4B and FIGS. 5A and 5B includes a semiconductor stack 12 where a n-type semiconductor layer 12n and a p-type semiconductor layer 12p are stacked. The semiconductor stack 12 emits light when a current flows between the n-side electrode 13 and the p-side electrode 15, and an active layer 12a is preferably provided between the n-type semiconductor layer 12n and the p-type semiconductor layer 12p.

An area where the p-type semiconductor layer 12p and the active layer 12a are partially absent, that is, an area that is recessed from the surface of the p-type semiconductor layer 12p (this area is referred to as a "step portion 12b") is formed to the semiconductor stack 12. The bottom surface of the step portion 12b is the exposed surface of the n-type semiconductor layer 12n, and the n-type semiconductor layer 12n and the n-side electrode 13 are electrically connected at a connecting portion 13a, which is an opening of a protective layer 16 provided at a part of the bottom surface of the step portion 12b. Also, a full-surface electrode 14, which is a reflective electrode 14a and a cover electrode 14b stacked together, is provided on substantially the whole of the upper surface of the p-type semiconductor layer 12p of the semiconductor stack 12. Furthermore, the surfaces of the semiconductor stack 12 and the full-surface electrode 14 are covered by the insulating protective layer 16 except for the whole of the lower surface of the semiconductor stack 12, the connecting portion 13a, which is a part of the bottom surface of the step portion 12b, and a part of the upper surface of the full-surface electrode 14 where the p-side electrode 15 is provided. Also, the light emitting element 1 has a protrusion-recess shape 12c for increasing the light extraction efficiency formed on the entire surface of the lower surface of the n-type semiconductor layer 12n. Such a protrusion-recess shape 12c can be formed, in the manufacturing steps for the light emitting device 100 described later, by performing etching after a growth substrate (for example, a sapphire substrate) for crystal growth of the semiconductor stack 12 is removed.

Moreover, the light emitting element 1 has the p-side electrode 15, which is a pad electrode on the p-side, formed on a part of the upper surface of the full-surface electrode 14, and has the n-side electrode 13, which is a pad electrode on the n-side, formed extending over substantially all of the upper surface and the side surfaces of the semiconductor stack 12 except for the area where the p-side electrode 15 is provided and its periphery, with the insulating protective layer 16 provided below the n-side electrode 13. That is, the light emitting element 1 has the n-side electrode 13 and the p-side electrode 15 formed on one surface side of the semiconductor stack 12. Also, by providing the n-side electrode 13 or the p-side electrode 15 over a wide area of the upper surface and the side surfaces of the light emitting element 1 in this manner, the heat dissipation property may be improved by efficiently conducting heat to the resin layer 31 of the supporting member 3 described later.

A semiconductor made of, for example, $In_XAl_YGa_{1-X-Y}N$ ($0 \leq X$, $0 \leq Y$, $X+Y<1$) is suitably used for the semiconductor stack 12 (the n-type semiconductor layer 12n, the active layer 12a, and the p-type semiconductor layer 12p). Also, each of the semiconductor layers may have a single layer structure, or a stacked structure having layers with different compositions, film thicknesses or the like, a superlattice structure, or the like. Particularly, the active layer 12a preferably has a single quantum well or multiple quantum well structure where thin films achieving a quantum effect are stacked.

The full-surface electrode 14 has functions of a current diffusion layer and a reflective layer, and is structured with the reflective electrode 14a and the cover electrode 14b stacked together. The reflective electrode 14a is provided to cover substantially the entire upper surface of the p-type semiconductor layer 12p. Also, the cover electrode 14b is provided to cover all of the upper surface and the side surfaces of the reflective electrode 14a. The reflective electrode 14a is a conductor layer for uniformly diffusing, over the entire surface of the p-type semiconductor layer 12p, the current supplied via the cover electrode 14b and the p-side electrode 15 provided to a part of the upper surface of the cover electrode 14b. Moreover, the reflective electrode 14a has good light reflectivity, and functions as a reflective film for reflecting light emitted by the light emitting element 1 toward the light extraction surface.

As the reflective electrode 14a, a metal material having good conductivity and reflectivity can be used. As a metal material having good reflectivity particularly in a visible light region, Ag, Al or any of alloys having these metals as the principal components may be suitably used. Furthermore, as the reflective electrode 14a, these metal materials can be used as a single layer or as a multilayer structure.

Furthermore, the cover electrode 14b is a barrier layer for preventing migration of a metal material forming the reflective electrode 14a. As the cover electrode 14b, a metal material having good conductivity and barrier properties can be used, and for example, Al, Ti, W, Au, an AlCu alloy or the like may be used. Also, as the cover electrode 14b, these metal materials can be used as a single layer or as a multilayer structure.

The n-side electrode 13 is electrically connected to the n-type semiconductor layer 12n at the opening of the protective layer 16 at the bottom surface of the step portion 12b. As shown by hatching in FIG. 4A, the connecting portion 13a between the n-type semiconductor layer 12n and the n-side electrode 13 is provided along the entire outer peripheral portion of the semiconductor stack 12. By providing the connecting portion 13a over a wide area in this manner, the current that is supplied via the n-side electrode 13 can be uniformly diffused on the n-type semiconductor layer 12n, and the luminous efficiency may be increased. Also, the p-side electrode 15 is provided to a part of the upper surface of the cover electrode 14b. As shown in FIGS. 2A and 2B and FIGS. 3A and 3B, a metal wire 32n and a metal wire 32p, which are internal wiring of the supporting member 3, are connected to the n-side electrode 13 and the p-side electrode 15 via the metal layer 33n and the metal layer 33p, respectively.

As the n-side electrode 13 and the p-side electrode 15, a metal material can be used, and for example, a single metal such as Ag, Al, Ni, Rh, Au, Cu, Ti, Pt, Pd, Mo, Cr, or W, or any of alloys having these metals as the principal components can be suitably used. Additionally, in the case of using an alloy, an alloy containing a non-metal element such as Si as a compositional element, such as an AlSiCu alloy, may also be used. Also, as the n-side electrode 13 and the p-side electrode 15, these metal materials can be used as a single layer or as a stacked multilayer structure.

The protective layer 16 is a coating film that has an insulating property and that covers the upper surface and the side surfaces of the semiconductor stack 12 and the full-surface electrode 14 other than the areas where the connecting portion 13a between the n-type semiconductor layer 12n and the n-side electrode 13, and the p-side electrode 15 are provided. The protective layer 16 functions as a protective film and an insulating film of the light emitting element 1. Also, the n-side electrode 13 is provided extending over a wide area on the upper surface of the protective layer 16. As the protective layer 16, a metal oxide or a metal nitride may be used, and for example, an oxide or a nitride of at least one type selected from the group consisting of Si, Ti, Zr, Nb, Ta and Al can be suitably used. Moreover, as the protective layer 16, light-transmissive dielectric materials of two or more types with different refractive indices may be stacked and a DBR (Distributed Bragg Reflector) film may be formed.

Additionally, the light emitting element 1 shown in FIGS. 4A and 4B and FIGS. 5A and 5B is only an example, and is not restrictive. It is enough if the light emitting element 1 has the n-side electrode 13 and the p-side electrode 15 provided on one surface side of the semiconductor stack 12, and the arrangement areas of the step portion 12b, the n-side electrode 13 and the p-side electrode 15, and the like may be determined as appropriate.

Returning to FIG. 1 to FIG. 3B, the structure of the light emitting device 100 will be further described. The phosphor layer (wavelength conversion layer) 2 is a wavelength conversion layer that absorbs a part or all of the light emitted by the light emitting element 1 and that converts the light into light of a wavelength different from the wavelength emitted by the light emitting element 1. The phosphor layer 2 may be formed as a resin layer containing particles of phosphor as a wavelength conversion material. Furthermore, the phosphor layer 2 is provided on the lower surface side of the n-type semiconductor layer 12n, which is provided with the protrusion-recess shape 12c (see FIG. 4B) and which is the light extraction surface of the light emitting element 1.

The film thickness of the phosphor layer 2 may be determined according to the amount of phosphor contained, the color desired to be obtained after mixing the color of light emitted by the light emitting element 1 and the color of light after wavelength conversion, or the like, and for example, it is 1 µm or more and 500 µm or less, and more preferably, 5 µm or more and 200 µm or less, and even more preferably, 10 µm or more and 100 µm or less.

As a resin material for forming the phosphor layer 2, one that is known in the field may be used, and preferably, one that has good light-transmissiveness with respect to light emitted by the light emitting element 1 and light after wavelength conversion by the phosphor contained in the phosphor layer 2 is used.

Also, the phosphor (wavelength conversion material) is not particularly limited as long as it is a fluorescent substance that is excited by light of a wavelength emitted by the light emitting element 1 and that emits fluorescence of a wavelength different from the excitation light, and two or more types may be uniformly mixed in the phosphor layer 2, or may be distributed in a multilayer structure.

The phosphor layer 2 may be formed by adjusting a slurry containing the resin mentioned above, the phosphor particles, and other inorganic filler particles in a solvent, applying the adjusted slurry to the lower surface of the semiconductor stack 12 by using a coating method such as a spraying method, a casting method or a potting method, and curing the same. Moreover, the phosphor layer 2 may be formed by separately fabricating a resin plate containing phosphor particles and adhering the resin plate to the lower surface of the semiconductor stack 12.

Alternatively, light emitted by the light emitting element 1 may be directly output with the lower surface of the semiconductor stack 12 as the light extraction surface, without providing the phosphor layer 2 in the light emitting device 100. Also, instead of the phosphor layer 2, a light-transmissive resin layer not containing phosphor may be provided, or a light diffusion resin layer containing a light diffusive filler may be provided.

The supporting member 3 is a reinforcing member that has a cuboid shape accommodating the outer shape of the light emitting element 1 in plan view, and that is bonded with the surface of the light emitting element 1 where the n-side electrode 13 and the p-side electrode 15 are provided so as to maintain the strength of the structure of the light emitting element 1 from which the growth substrate 11 (see FIGS. 8A to 8D) is removed. Also, the supporting member 3 has substantially the same outer shape as the phosphor layer 2 in plan view. The supporting member 3 includes the resin layer 31, the external connection electrodes 34n and 34p to be mounted on a mounting substrate, and internal wiring (the metal wires 32n and 32p, and the metal layers 33n and 33p) for electrically connecting the n electrode 13 and the p electrode 15 with the external connection electrodes 34n and 34p of corresponding polarities, respectively.

The resin layer 31 is a main body as a reinforcing member of the light emitting element 1. Also, as shown in FIG. 2B and FIGS. 3A and 3B, the resin layer 31 has substantially the same outer shape as the supporting member 3, and in plan view, accommodates the outer shape of the light emitting element 1 and has substantially the same outer shape as the phosphor layer 2. Moreover, the resin layer 31 is a sealing resin layer for sealing the upper surface and the side surfaces of the light emitting element 1. Accordingly, the light emitting element 1 has its entire surface sealed by the resin layer 31 and the phosphor layer 2, which is a resin layer provided on the lower surface side. Also, the step portion 31g is provided on the side surfaces in the longitudinal direction and the side surfaces in the lateral direction of the resin layer 31, with the position $H_D$ in the height direction as the boundary, and in plan view, the portion lower than the position $H_D$ is formed to be on the inner side than the portion higher than the position $H_D$.

The resin layer 31 includes inside, as the internal wiring, the metal wires 32n and 32p, and the metal layers 33n and 33p. The side surfaces of the metal layers 33n and 33p, which are the internal wiring on the lower layer side, are sealed by the resin layer 31 so as not to be exposed from the resin layer 31. Also, the metal wires 32n and 32p, which are the internal wiring on the upper layer side, are provided in such a way as to be exposed at the side surfaces in the longitudinal direction, the side surfaces in the lateral direction and the upper surface of the resin layer 31. Also, the exposed surfaces of the metal wires 32n and 32p are formed to be flat so as to form the same plane as the side surfaces or the upper surface of the resin layer 31 where they are exposed.

Additionally, the exposed surfaces of the metal wires 32n and 32p from the resin layer 31 are covered by the external connection electrodes 34n and 34p. For this reason, the surfaces of the external connection electrodes 34n and 34p are formed to be higher than the corresponding side surface or upper surface of the resin layer 31 by the amount of the film thickness.

As the resin material of the resin layer 31, a resin material similar to that used for the phosphor layer 2 described above can be used. Also, in the case of forming the resin layer 31 by compression molding, an EMC (epoxy mold compound), which is a powder epoxy resin, an SMC (silicone mold compound), which is a powder silicone resin, or the like can be suitably used as a raw material, for example.

Furthermore, to increase the heat conductivity, a heat conductive member may be included in the resin layer 31. By increasing the heat conductivity of the resin layer 31, heat generated by the light emitting element 1 can be swiftly conducted and dissipated to the outside. As the heat conductive member, a powder carbon black, AlN (aluminum nitride) or the like can be used, for example. Additionally, in the case where the heat conductive member is a material having conductivity, the heat conductive member is included at a particle density within such a range that the resin layer 31 would not have conductivity.

Furthermore, as the resin layer 31, a white resin obtained by mixing a light reflective filler in a light-transmissive resin material may be used. In the case where the white resin is used at least on the lower layer section of the resin layer 31 that is bonded with the upper surface of the light emitting element 1 to cause the resin layer 31 on the side adjacent to the light emitting element 1 to function as a light reflective film, light leaked from the upper surface and the side surfaces of the light emitting element 1 may be returned to inside the light emitting element 1, and thus, the efficiency of light extraction from the lower surface side of the light emitting element 1, which is a light extraction surface, may be increased. Also, in the case where the resin layer 31 has the function as a light reflective film, the full-surface electrode 14 of the light emitting element 1 may be formed by using a light-transmissive conductive material such as ITO (indium tin oxide), IZO (indium zinc oxide) or the like.

With respect to the thickness of the resin layer 31, a lower limit may be set so that enough strength may be achieved as the reinforcing member for the light emitting element 1 from which the growth substrate is stripped off. Furthermore, in the case of enabling side-view mounting, the lower limit is preferably determined taking into account the distances between the external connection electrodes 34n and 34p and the phosphor layer 2 so that an adhesive material such as solder does not extend to the phosphor layer 2 from an-side electrode connecting portion.

For example, from the standpoint of being a reinforcing member, the thickness of the resin layer 31 is preferably about 30 μm or more. Further preferably, the thickness of the resin layer 31 is about 100 μm or more and 300 μm or less so as to enable stable mounting of the light emitting device 100 at the time of mounting on a mounting substrate in a side-view manner with the side surface portion of the resin layer 31 as the mounting surface. Furthermore, from the standpoint of preventing spreading of an adhesive material to the phosphor layer 2, the phosphor layer 2 is preferably separated from the external connection electrodes 34n and 34p by about 30 μm or more, and more preferably, the distance is about 80 μm or more. Additionally, in the present embodiment, the metal wires 32n and 32p are connected with the external connection electrodes 34n and 34p on the side surface portions of the resin layer 31, and thus, the upper limit of the thickness of the resin layer 31 is not particularly specified.

The metal wire (n-side metal wire) 32n is provided on the inside the resin layer 31, and together with the metal layer 33n, forms internal wiring for electrically connecting the n-side electrode 13 and the external connection electrode 34n. A part of the lower surface (first surface) of the metal wire 32n is bonded with the upper surface (second surface opposite to the first surface) of the metal layer 33n provided on top of the n-side electrode 13, and the entire upper surface and a part of the side surface of the metal wire 32n are bonded with the external connection electrode 34n. Moreover, the metal wire 32n functions also as a heat transfer route for dissipating heat generated by the light emitting element 1.

The metal wire 32n is bonded with the upper surface of the metal layer 33n through the lower surface (first surface), that is, the side surface of the wire shape, and thus, the metal wire 32n and the metal layer 33n may be bonded in a wider area compared to a case of bonding through an end surface of the metal wire 32n. Moreover, by causing the side surface of the wire shape to be bonded with the upper surface of the metal layer 33n and across the full width of the lateral direction (Y-axis direction) of the metal layer 33n when providing the metal wire 32n in such a way as to penetrate the resin layer 31 in the lateral direction, the bonded area of the metal wire 32n and the metal layer 33n may be further increased. By bonding the metal wire 32n and the metal layer 33n across a wider area, the heat conductivity from the metal layer 33n to the metal wire 32n may be increased, and as a result, the heat dissipation property of the light emitting device 100 may be improved. Additionally, the same thing may be applied in the case of bonding the side surface of the wire shape of the metal wire 32n and the upper surface of the n-side electrode 13 without providing the metal layer 33n.

The metal wire 32n is formed by using a ribbon-shaped wire whose cross-sectional shape (the shape of the transverse plane, of the wire shape, which is a cross-section along the surface that is perpendicular to the extending direction of the wire shape) is a rectangle. In plan view, the metal wire 32n is disposed parallel to the lateral-direction side of the semiconductor stack 12 (along the Y-axis direction). Moreover, a part of the side surface (the lower surface in FIG. 2B and FIGS. 3A and 3B) of the wire shape of the metal wire 32n is connected to the upper surface of the metal layer 33n, and both end surfaces (the side surfaces in FIG. 2B and FIGS. 3A and 3B), which are the transverse planes of the wire shape, are provided exposed at both side surfaces of the resin layer 31 in the longitudinal direction. Furthermore, other portions corresponding to the side surface of the wire shape of the metal wire 32n having curved shapes are provided so that a portion of the metal wire 32n is exposed at the side surface in the lateral direction and at the upper surface of the resin layer 31. Additionally, the upper surface of the metal wire 32n is processed into a flat surface by machining.

Figure 11:
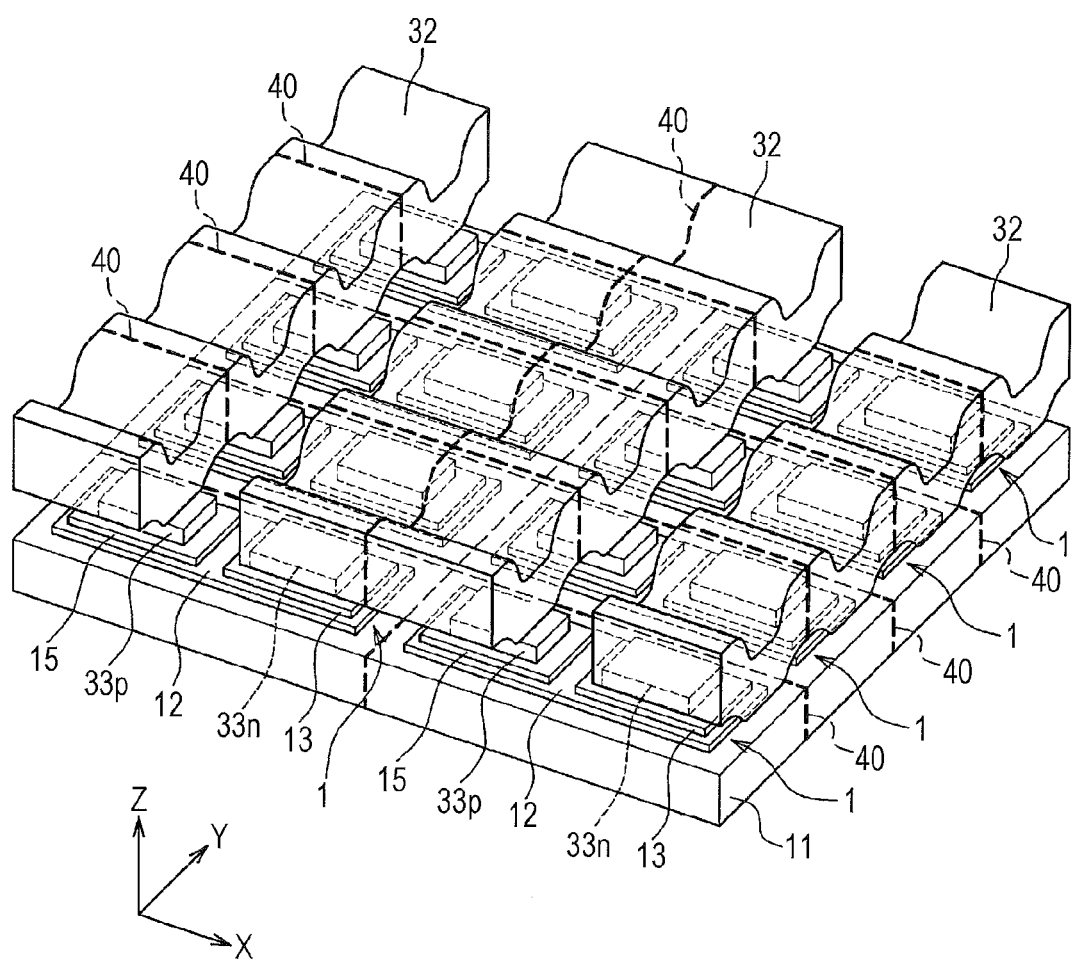
FIG. 11 is a schematic perspective view showing the wire wiring step in the manufacturing steps for the light emitting device according to the first embodiment of the present invention.
Figure 12A:
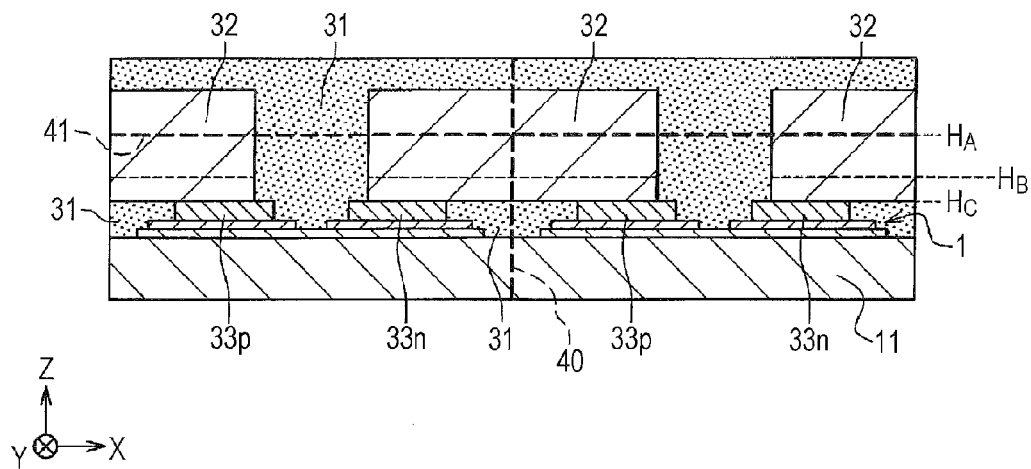
Figure 12B:
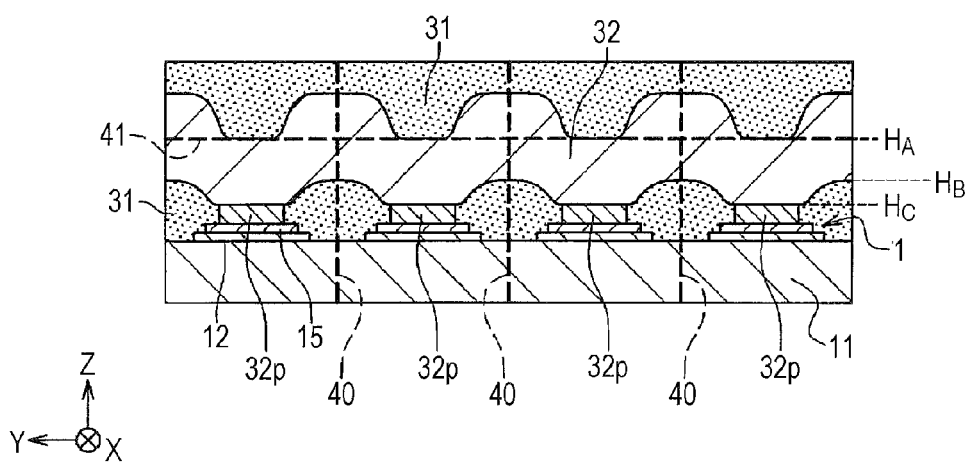

Also, the metal wire 32n is disposed while being bent in a wave shape or in an arc shape with the portion above the metal layer 33n being the trough (see FIG. 11 and FIGS. 12A and 12B). In this manner, by bending and wiring the metal wire 32n, the volume of metal in the supporting member 3 (the resin layer 31) can be increased. Also, the metal wire 32n is provided penetrating in the lateral direction of the resin layer 31, and the volume of metal in the supporting member 3 can be increased. Furthermore, with both end surfaces of the metal wire 32n being exposed from the resin layer 31 with relatively low heat conductivity, heat can be easily dissipated to the outside via both end surfaces of the metal wire 32n. The forming method of the metal wire 32n will be described later in detail.

The metal wire 32n is exposed from the resin layer 31 at other than the side surface in the lateral direction facing the metal wire 32p, that is, at the entire surface of the other side surface in the lateral direction, portions of both side surfaces in the longitudinal direction higher than a position $H_B$, and the entire upper surface. These exposed surfaces where the metal wire 32n is exposed from the resin layer 31 are formed to be flat so as to form the same plane as the corresponding side surface or upper surface of the resin layer 31. Also, these exposed surfaces where the metal wire 32n is exposed from the resin layer 31 are covered by the external connection electrode 34n.

As shown in FIGS. 2A and 2B, and FIGS. 3A and 3B, when the height of the bonding surface (the position in the Z-axis direction) of the metal wire 32n and the metal layer 33n is given as a position $H_C$, the metal wire 32n has its side surfaces in the longitudinal direction, at a lower portion from the position $H_C$ to the position $H_B$, covered by the resin layer 31, and its side surfaces in the longitudinal direction, at an upper portion from the position $H_B$ to a position HA, exposed from the resin layer 31.

Also, the side surface of the metal wire 32n in the lateral direction has substantially the same shape as the cross-sectional shape shown in FIGS. 3A and 3B, and the entire surface thereof is exposed at the side surface of the resin layer 31 in the lateral direction. Accordingly, the outer shape of the exposed surface of the metal wire 32n in a side view in the lateral direction is such that a portion corresponding to the width of the metal layer 33n is horizontal with respect to the upper surface of the electrode (a surface perpendicular to the XY plane) at the lowermost position $H_C$, a portion from the position $H_C$ to the position $H_B$, which is at the lowermost end of the exposed surface in the longitudinal direction, is inclined to be wider from the position $H_C$ toward the position $H_B$, a portion from the position $H_B$ to the position HA is vertical with respect to the upper surface of the electrode at the upper end, and a portion at the position HA is horizontal with respect to the upper surface of the electrode.

The metal wire (p-side metal wire) 32p is provided on the inside of the resin layer 31, and together with the metal layer 33p, forms internal wiring for electrically connecting the p-side electrode 15 and the external connection electrode 34p. A part of the lower surface of the metal wire 32p is bonded with the upper surface of the metal layer 33p provided on top of the p-side electrode 15, and the entire upper surface and a part of the side surface of the metal wire 32p are bonded with the external connection electrode 34p. Moreover, the metal wire 32p functions also as a heat transfer route for dissipating heat generated by the light emitting element 1. The structure of the metal wire 32p is substantially the same as that of the metal wire 32n, and detailed description thereof is omitted.

The exposed surfaces of the metal wires 32n and 32p from the resin layer 31 are provided with the external connection electrodes 34n and 34p, and are made the mounting surface at the time of top-view mounting. Also, the exposed surfaces of the metal wires 32n and 32p at the side surfaces of the resin layer 31 in the longitudinal direction are provided with the external connection electrodes 34n and 34p, and are made the mounting surfaces at the time of side-view mounting. Accordingly, the exposed surfaces of the metal wire 32n and the exposed surfaces of the metal wire 32p are preferably separated by about 200 μm or more on the upper surface and the side surfaces in the longitudinal direction, for example, so as to prevent short-circuiting due to spreading of an adhesive material at the time of mounting. Additionally, in the present embodiment, the external connection electrodes 34n and 34p are provided only on the exposed surfaces of the metal wires 32n and 32p, but in the case of providing the external connection electrodes 34n and 34p to extend over the upper surface and the side surfaces of the resin layer 31, the external connection electrode 34n and the external connection electrode 34p are preferably separated by about 200 μm or more, for example.

As the metal wires 32n and 32p, a material having good electrical conductivity and heat conductivity is preferably used, and Au, Cu, Al, Ag, or any of alloys having these metals as the principal components can be suitably used. Also, coating may be applied to the surfaces of the metal wires. Furthermore, with respect to efficient conduction of heat generated by the light emitting element 1, the greater the volume of the metal wires 32n and 32p in the supporting member 3, the more preferable. To inexpensively configure large-volume metal wires 32n and 32p, Al, Cu or any of alloys having these metals as the principal components is preferably used. Also, at the time of forming the metal wires 32n and 32p, in order to easily bend and dispose large-volume wires, that is, wires having large cross-sectional areas, it is preferable to use a relatively soft material such as Al, Au or any of alloys having these metals as the principal components.

The cross-sectional shape of wires used for forming the metal wires 32n and 32p is not particularly limited, and it may be an oval, a circle, a square or the like instead of a rectangle, but wires having a rectangular cross-section are preferable since bonding with the upper surfaces of the metal layers 33n and 33p with high adhesiveness and over large areas is enabled. Also, by using a rectangular cross-section, a load is applied uniformly to the metal layers 33n and 33p at the time of wire-bonding, and the impact on the semiconductor stack 12 on the lower side of the metal layers 33n and 33p can be reduced. Accordingly, the damage to the semiconductor stack 12 can be reduced when using wires having the same cross-sectional area compared to a case of using wires having round cross-sections. Moreover, in the case where the supporting member 3 has a cuboid shape, if a wire having a rectangular cross-section is used, the wire can be disposed by being bent in such a way as to reduce the gap within the shape of the supporting member 3. This is preferable because the volumes of the metal wires 32n and 32p in the supporting member 3 can thus be increased.

The diameter of wires used for forming the metal wires 32n and 32p can be selected as appropriate according to the size of the supporting member 3. For example, an Al wire having a rectangular cross-section having a size of up to about 1000 μm×500 μm can be used. Also, an Ag wire having a circular cross-section with a diameter of up to about 100 μm, or a Cu wire or an Al wire having a circular cross-section with a diameter of up to about 300 μm can be used.

Specifically, in the case where the cross-sections of the metal wires 32n and 32p are a rectangle, considering stable mounting of the light emitting device 100 and heat dissipation to the mounting substrate, the length of the short side of the rectangle (that is, the thickness of the metal wires 32n and 32p) is preferably about 100 m or more, and more preferably about 150 μm or more, and even more preferably about 200 μm or more. Also, considering the stress (strain) on the light emitting element 1 when connecting the metal wires 32n and 32p, the length (thickness) of the short sides of the cross-sections of the metal wires 32n and 32p is preferably about 700 μm or less, and more preferably 400 μm or less, and even more preferably about 350 μm or less, and still more preferably about 250 μm or less.

Also, on the side surface of the resin layer 31 in the longitudinal direction, the width of the exposed surfaces of the metal wires 32n and 32p (the distance between the position HA and the position $H_B$) in the Z-axis direction, which is the height direction (that is, the stacking direction of the semiconductor stack 12), is preferably about one-third or more of the width of the resin layer 31 (the distance between the position HA and a position HE). Furthermore, each of the areas of the end surfaces of the metal wires 32n and 32p exposed at the side surfaces of the resin layer 31 in the longitudinal direction is preferably about 10000 μm² or more, and more preferably about 20000 μm² or more. The light emitting device 100 may then be mounted more stably, and the heat dissipation to the mounting substrate may be increased. Additionally, also in the case where the shape of the exposed surfaces of the metal wires 32n and 32p on the side surface of the resin layer 31 in the longitudinal direction is other than a rectangle, such as a circle, the width in the height direction (for example, in the case of a circle, the diameter of the circle) is preferably one-third or more of the width of the resin layer 31 in the height direction, and the same thing can be said for the area of the exposed surface as for the case of a rectangle.

Also, the length (width) of the long sides of the cross-sections of the metal wires 32n and 32p may be selected as appropriate according to the width of the supporting member 3 in the longitudinal direction, but considering the mountability of the light emitting device 100, each area is preferably about 50 μm or more, and more preferably about 75 μm or more. Also, the exposed surface of the metal wire 32n and the exposed surface of the metal wire 32p are preferably separated by about 200 μm or more so that short-circuiting between the exposed surfaces at the time of mounting may be prevented. Thus, with respect to the upper limit of the total of the width of the metal wire 32n and the width of the metal wire 32p, if the width of the supporting member 3 in the longitudinal direction is about 500 μm, the widths of the metal wires 32n and 32p may be about 300 μm or less in total, and if the width of the supporting member 3 in the longitudinal direction is about 2 mm, the widths of the metal wires 32n and 32p may be about 1800 μm or less in total.

Additionally, as shown in FIGS. 10A to 10D, in a wire wiring step S103 (see FIG. 7) described later, in the case of connecting one metal wire 32 at the same time to the metal layer 33n of one of adjacent light emitting elements 1 and the metal layer 33p of the other light emitting element 1, the width of the metal wire 32 to be disposed can be the total of the width of the metal wire 32n and the width of the metal wire 32p. That is, in the case where the width of the supporting member 3 in the longitudinal direction is about 500 μm, the width of the metal wire 32 is preferably 300 μm or less, and in the case where the width of the supporting member 3 in the longitudinal direction is about 2 mm, the width of the metal wire 32 is preferably about 1800 μm or less.

The metal layer (n-side metal layer, electrode) 33n is internal wiring on the lower layer side provided on the n-side electrode 13, and the metal wire 32n, which is the internal wiring on the upper layer side, is bonded on the upper surface of the metal layer 33n. Similarly, the metal layer (p-side metal layer, electrode) 33p is an internal wiring on the lower layer side provided on the p-side electrode 15, and the metal wire 32p, which is the internal wiring on the upper layer side, is bonded on the upper surface of the metal layer 33p. The metal layers 33n and 33p function as shock absorbing layers at the time of bonding the metal wires 32n and 32p by using a wire bonder, and thus are for reducing damage to the semiconductor stack 12. Accordingly, the film thickness of the metal layers 33n and 33p is preferably about 3 μm or more and 50 μm or less, and more preferably about 20 μm or more and 30 μm or less. Furthermore, the metal layers 33n and 33p are embedded in the resin layer 31 without being exposed, and have the function of increasing the height of the position $H_B$ of the lower end of the exposed surfaces of the metal wires 32n and 32p on the side surfaces in the longitudinal direction. Additionally, the metal layers 33n and 33p may be assumed to be parts of the pad electrodes provided as the uppermost layers of the n-side electrode 13 and the p-side electrode 15.

Additionally, in the case where the n-side electrode 13 and the p-side electrode 15, which are the pad electrodes of the light emitting element 1, are able to absorb the impact at the time of wire-bonding, the metal wires 32n and 33p may be directly bonded with the n-side electrode 13 and the p-side electrode 15 without the metal layers 33n and 33p being provided. Also, in the case of not providing the metal layers 33n and 33p, the loop shape of the wires may be adjusted at the time of dispoing the metal wires 32n and 32p to the n-side electrode 13 and the p-side electrode 15 to thereby separate the position $H_B$ of the lower end of the exposed surfaces of the metal wires 32n and 32p on the side surfaces in the longitudinal direction from the position HE of the lower surface of the light emitting element 1 by a predetermined distance or more.

As the metal layers 33n and 33p, Cu, Au, Al or any of alloys having these metals as the principal components can be suitably used. Also, the metal layers 33n and 33p may have a stacked structure using a plurality of types of metal. The metal layers 33n and 33p may be formed by an electroplating method. Also, the metal layers 33n and 33p may be formed by using wire bumps that are formed at the time of ball-bonding the metal wires.

The external connection electrode (n-side external connection electrode) 34n and the external connection electrode (p-side external connection electrode) 34p are pad electrodes for bonding the light emitting device 100 to an external mounting substrate, and are provided in such a way as to be electrically connected to the exposed surfaces of the metal wires 32n and 32p, which are internal wiring, from the resin layer 31. Additionally, the exposed surfaces of the metal wires 32n and 32p from the resin layer 31 may be made connection surfaces with the outside for mounting, without providing the external connection electrodes 34n and 34p.

Furthermore, to increase the bondability with the mounting substrate in which a bonding material of Au-based alloy such as Au—Sn eutectic solder is used, at least the uppermost layers of the external connection electrodes 34n and 34p are preferably formed of Au. For example, in the case where the metal wires 32n and 32p are formed of metal other than Au, such as Cu or Al, to increase the adhesiveness with Au, it is preferable to first form a thin Ni film and then to stack the Au layer on the Ni layer by an electroless plating method. Also, stacking may be performed with a Pd layer between Ni layer and Au layer such as Ni/Pd/Au. Furthermore, the total film thickness of each of the external connection electrodes 34n and 34p may be about 0.1 μm or more and 5 μm or less, or more preferably about 0.5 μm or more and 4 μm or less.

Next, referring to FIGS. 6A to 6D, side-view mounting of the light emitting device 100 and heat dissipation by internal wiring will be described. Additionally, in FIGS. 6A to 6D, for the sake of simple explanation, the external connection electrode 34p (see FIG. 3A) is omitted, and the light emitting device 100 is assumed to be directly bonded with a mounting substrate 90 on the exposed surface of the metal wire 32p from the resin layer 31. In the same manner, description is given with respect to light emitting devices 200, 300 and 400 according to reference examples assuming that the light emitting devices 200, 300 and 400 are directly bonded with the mounting substrate 90 on the exposed surfaces of metal layers 234, 334 and 434, which are internal wiring on the upper layer side, from the resin layer 31. Also, FIGS. 6A to 6D show cross-sections of the electrodes and the internal wiring on the p-side, and since the same thing applies for the electrodes and the internal wiring on the n-side, illustration of the n-side will be omitted.

Figure 6A:
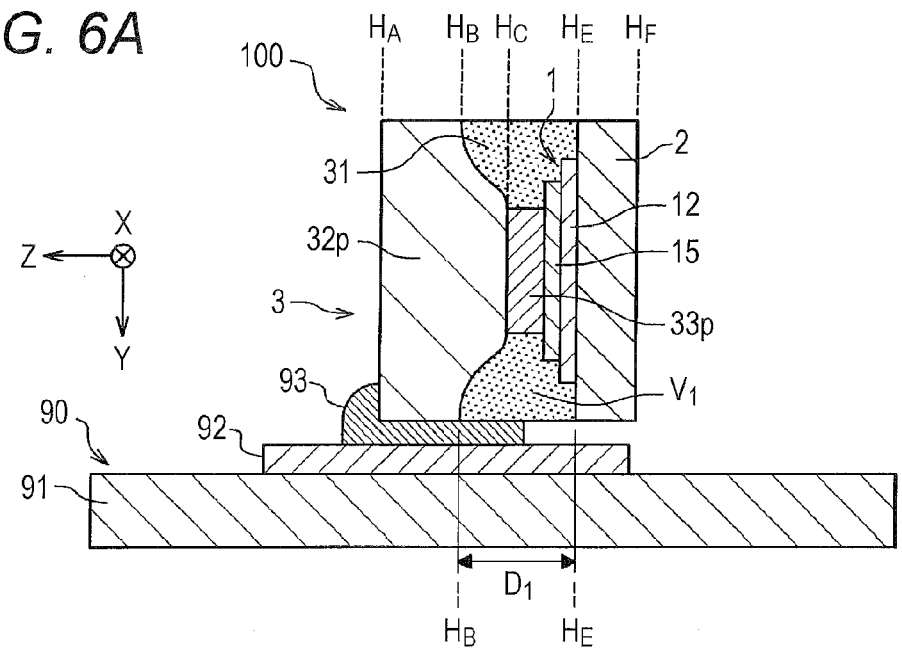

FIG. 6A shows side-view mounting of the light emitting device 100 on the mounting substrate 90. One of side surfaces in the longitudinal direction of the light emitting device 100 is made the mounting surface, and the metal wire 32p exposed to the mounting surface is bonded with a wiring pattern 92 provided on the upper surface of a substrate 91 using a conductive adhesive material 93 such as solder.

At this time, the adhesive material 93 may spread not only over the exposed surface of the metal wire 32p, but also over the peripheral region of the exposed surface due to the weight of the light emitting device 100 or the pressure applied by the light emitting device 100 at the time of mounting. Then, when the adhesive material 93 reaches the phosphor layer 2, which is the light extraction surface of the light emitting device 100, the light extraction surface may be polluted by the adhesive material 93, which may lead to reduction in the light extraction efficiency. Accordingly, a distance $D_1$ between the position $H_B$ of the lower end (the lower end in the Z-axis direction; the right end in FIGS. 6A to 6D) of the exposed surface of the metal wire 32p, which is an external connection region, and the position HE of the upper end of the light extraction surface is made to be a predetermined distance or more on the mounting surface at the time of side-view mounting. Although dependent on the size of the light emitting device 100 and the like, this predetermined distance may be 100 m, for example.

In this manner, from the standpoint of prevention of pollution of the light extraction surface at the time of mounting, a greater distance $D_1$ is more preferable. However, if the distance $D_1$ is increased, the proportion of the volume of the resin layer 31 is increased, and the heat dissipation property of efficiently transferring heat generated by the light emitting element 1 to the outside may be reduced. Here, the heat dissipation property of the light emitting device 100 will be described by considering a case of forming, to the light emitting device 100, internal wiring on the upper layer side by using, instead of the metal wire 32p, a metal layer (for example, a plated layer) whose transverse cross-sectional view has a constant shape and which has a columnar shape whose axis is along the Z-axis direction.

Figure 6B:
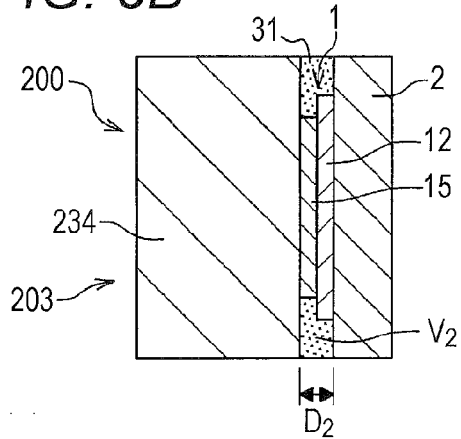
Figure 6C:
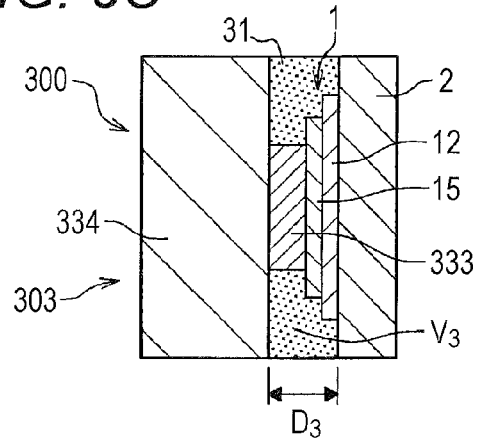

In a light emitting device 200 according to a reference example shown in FIG. 6B, a metal layer 234 is provided so that a position of an upper surface of the p-side electrode 15 corresponds to a lower end (right end in FIG. 6B) of the metal layer 234, and the portion higher, and the portion higher (positive direction of the Z-axis) than the position of the lower end is made the exposed surface that is exposed from the resin layer 31. In this case, the proportion of a volume $V_2$ of the resin layer 31 in a supporting member 203 is extremely small, and the proportion of the metal layer 234 is great, and the light emitting device 200 may achieve a very good heat dissipation property. However, a distance $D_2$ between the lower end of the exposed surface of the metal layer 234 and the upper surface of the phosphor layer 2, which is the light extraction surface (that is, the lower surface of the light emitting element 1), is small, and the light extraction surface may be easily polluted by the adhesive material 93 at the time of mounting.

Furthermore, in a light emitting device 300 according to a reference example shown in FIG. 6B, a metal layer 334 is provided so that a position of an upper surface of the metal layer 333 provided on an upper surface of the p-side electrode 15 corresponds to a lower end (right end in FIG. 6C) of the metal layer 334, and the portion higher (positive direction of the Z-axis) than the position of the lower end is made the exposed surface that is exposed from the resin layer 31. The metal layer 333 here is the same as the metal layer 33p of the light emitting device 100, and is for increasing the height of the lower end position of the exposed surface of the metal layer 334 at the side surface. In this case, the proportion of a volume $V_3$ of the resin layer 31 in a supporting member 303 is relatively small, and the proportion of the metal layer 334 is great, and the light emitting device 300 may achieve a good heat dissipation property. However, a distance $D_3$ between the lower end of the exposed surface of the metal layer 334 and the upper surface of the phosphor layer 2, which is the light extraction surface (that is, the lower surface of the light emitting element 1), is relatively small, albeit greater than the distance $D_2$ at the light emitting device 200, and is not enough to prevent pollution of the light extraction surface by the adhesive material 93 at the time of mounting.

Figure 6D:
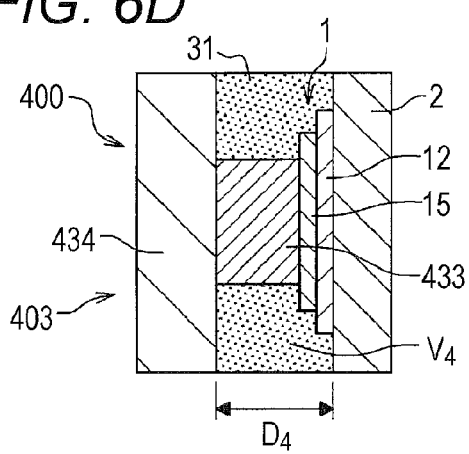

Furthermore, in a light emitting device 400 according to a reference example shown in FIG. 6D, a metal layer 434 is provided so that an upper surface of a metal layer 433 provided on the upper surface of the p-side electrode 15 corresponds to a lower end (right end in FIG. 6D) of the metal layer 434, and the portion higher (positive direction of the Z-axis) than the position of the lower end is made the exposed surface that is exposed from the resin layer 31. The metal layer 433 here has such a thickness that the position of the upper surface is equal to the position $H_C$ of the lower end of the exposed surface of the metal wire 32p of the light emitting device 100 shown in FIG. 6A. In this case, a distance $D_4$ between the lower end of the exposed surface of the metal layer 434 and the upper surface of the phosphor layer 2, which is the light extraction surface (that is, the lower surface of the light emitting element 1), is sufficiently great, and thus pollution of the light extraction surface by the adhesive material 93 at the time of mounting may be effectively prevented. However, the proportion of a volume $V_4$ of the resin layer 31 in a supporting member 403 is great, and the proportion of the metal layer 434 is small, and the heat dissipation property of the light emitting device 400 is greatly reduced compared to the light emitting device 300.

The light emitting device 100 according to the embodiment of the present invention is structured to have a taper-shape with the side surface of the lower portion inclined, from the lower ends (position He) of the metal wires 32n and 32p to the lower ends (position $H_B$) of the exposed surfaces at the side surfaces of the resin layer 31 in the longitudinal direction. In other words, metal members 32n and 32p respectively have a first surface, a second surface opposite to the first surface, a side surface extending from the second surface toward the first surface, and a tapered surface tapered from the side surface to the first surface. The metal members 32n and 32p are provided in the resin layer 31 and electrically connected to the upper surface of the electrodes 13 and 15 via the first surface. The side surface of the metal members 32n and 32p are exposed from the resin layer 31. Accordingly, the distance $D_1$ between the lower end (position $H_B$) of the exposed surface of the metal wire 32p at the side surface of the resin layer 31 in the longitudinal direction and the upper surface (position HE) of the phosphor layer 2 is the same as the distance $D_4$ at the light emitting device 400. Thus, pollution of the light extraction surface by the adhesive material 93 at the time of mounting can be effectively prevented. On the other hand, since the lower portion of the metal wire 32p is taper-shaped, the volume $V_3$ of the resin layer 31 in the supporting member 3 can be made smaller than the volume $V_4$ of the resin layer 31 at the light emitting device 400. Accordingly, the light emitting device 100 can achieve a better heat dissipation property than the light emitting device 400.

Additionally, the exposed surface of the metal wire 32p of the light emitting device 100 at the side surface of the resin layer 31 in the lateral direction has the same cross-sectional shape as the metal wire 32p shown in FIG. 6A. Accordingly, the lower end of this exposed surface is at the position $H_C$ at the upper surface of the metal layer 33p. The exposed surface of the metal wire 32p at the side surface in the lateral direction is not a mounting surface, but is continuous with the exposed surface at the side surface in the longitudinal direction, and thus, in the case where the exposed surface in the longitudinal direction is made the mounting surface, the adhesive material 93 may possibly extends toward the phosphor layer 2 along the side surface in the lateral direction. In the light emitting device 100, since the lower portion of the metal wire 32p has a tapered shape, the position $H_B$ at the lower end of the exposed surface of the metal wire 32p at the side surface in the longitudinal direction is sufficiently separated from the position $H_C$ at the lower end of the exposed surface of the metal wire 32p at the side surface in the lateral direction. Accordingly, the adhesive material 93 can be effectively prevented from extending to the position HE of the upper surface of the phosphor layer 2 along the exposed surface of the metal wire 32p at the side surface in the lateral direction and via the lower end of the position $H_C$.

Operation of Light Emitting Device

Next, with reference to FIG. 1 to FIG. 5B, an operation of the light emitting device 100 will be described. Additionally, for the sake of convenience, description is given assuming that the light emitting element 1 emits blue light and the phosphor layer 2 emits yellow light.

According to the light emitting device 100, when an external power source is connected to the external connection electrodes 34n and 34p, which are positive and negative electrodes, via a mounting substrate (for example, see the mounting substrate 90 in FIG. 6A), a current is supplied between the n-side electrode 13 and the p-side electrode 15 of the light emitting element 1 via the metal wires 32n and 32p and the metal layers 33n and 33p, which are internal wirings. Then, when a current is supplied between the n-side electrode 13 and the p-side electrode 15, the active layer 12a of the light emitting element 1 emits blue light.

The blue light emitted by the active layer 12a of the light emitting element 1 propagates within the semiconductor stack 12 and is emitted from the lower surface of the light emitting element 1, and a part of the light is absorbed by the phosphor contained in the phosphor layer 2 and is extracted to the outside after being converted into yellow light. Also, a part of the blue light passes through the phosphor layer 2 without being absorbed by the phosphor, and is extracted to the outside. Additionally, light propagating upward within the light emitting element 1 is reflected downward by the reflective electrode 14a, and is emitted from the lower surface of the light emitting element 1. Then, the yellow light and the blue light extracted to the outside of the light emitting device 100 are mixed, and thus white light is obtained.

Manufacturing Method of Light Emitting Device

Figure 7:
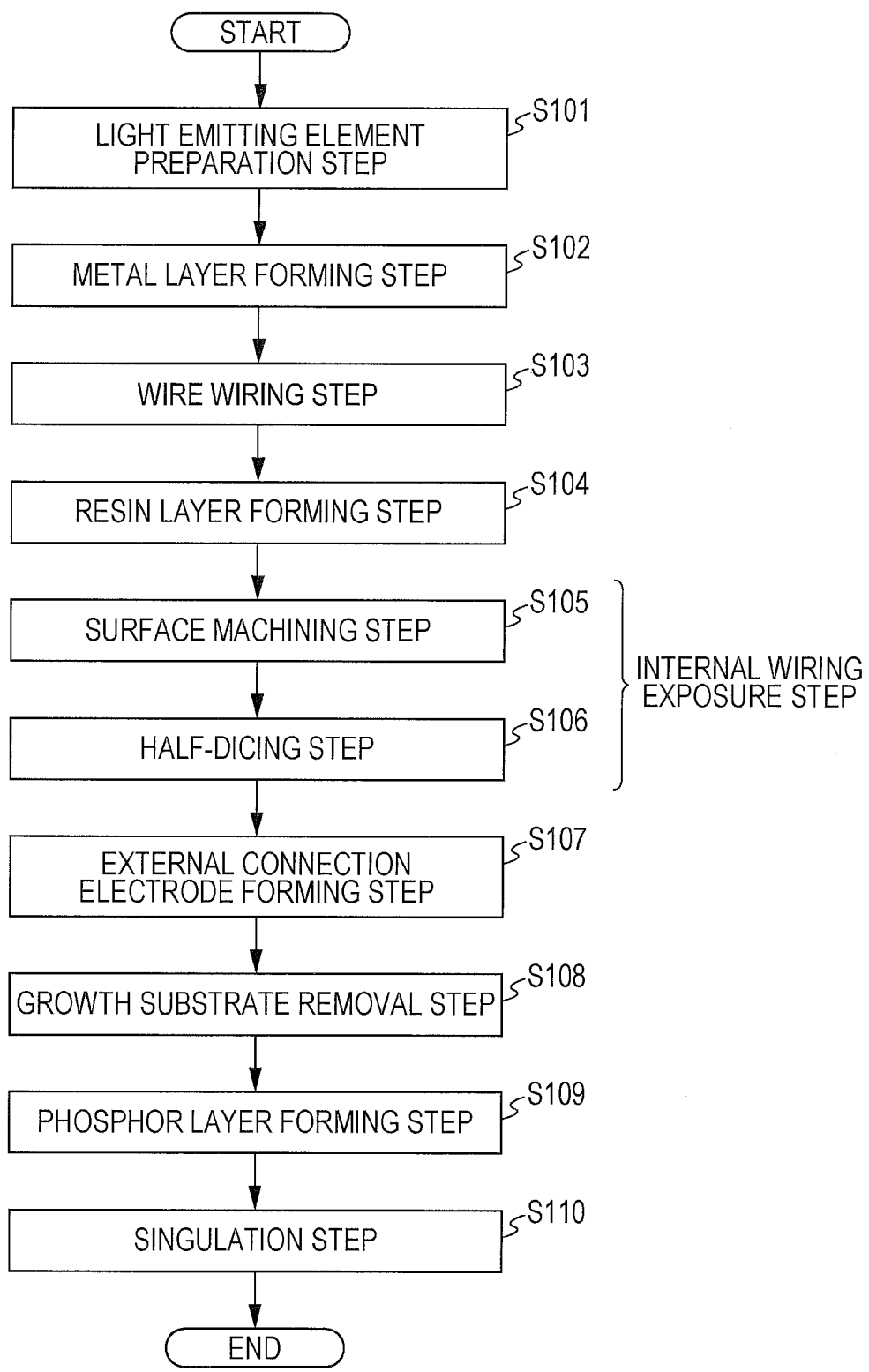
FIG. 7 is a flow chart showing a manufacturing method of the light emitting device according to the first embodiment of the present invention.
Figure 8A:
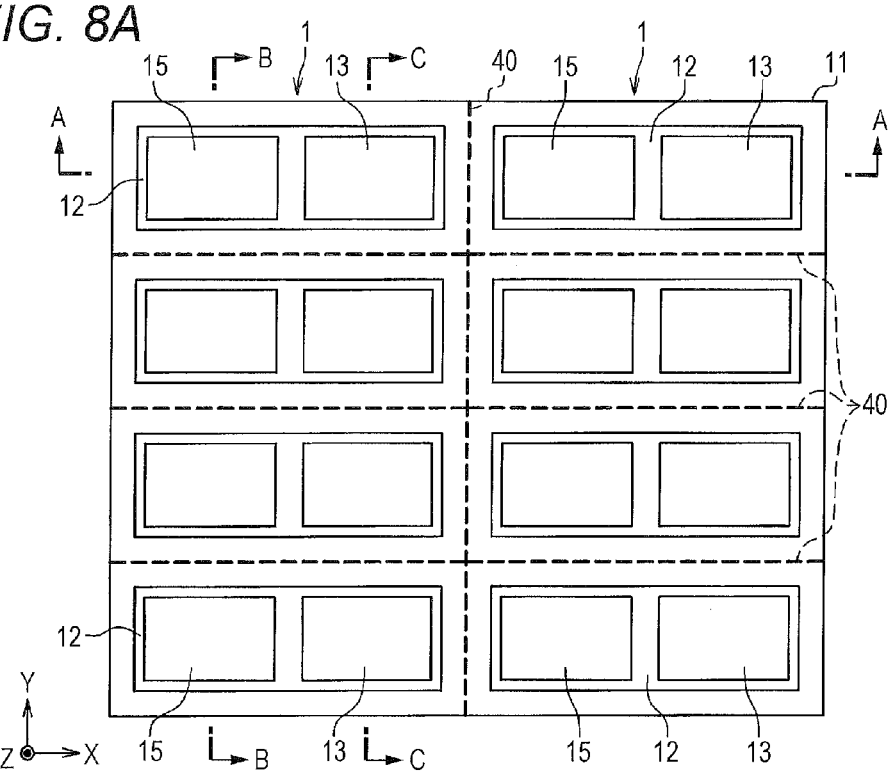
Figure 8B:
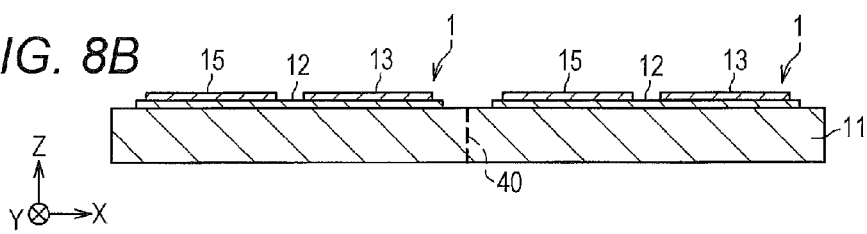
Figure 8C:
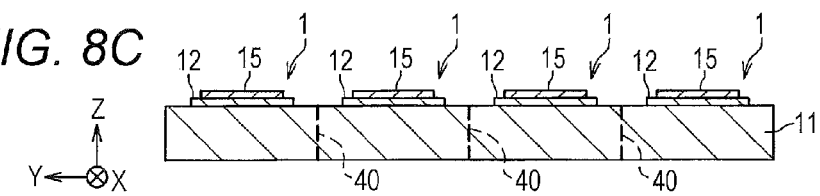
Figure 8D:
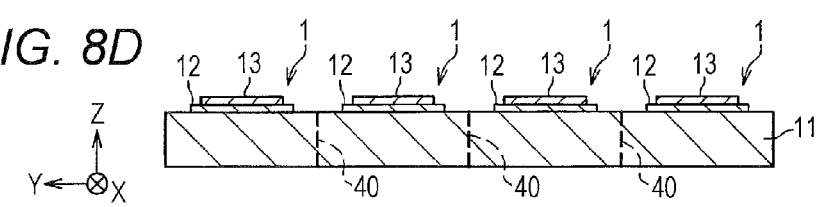
Figure 9A:
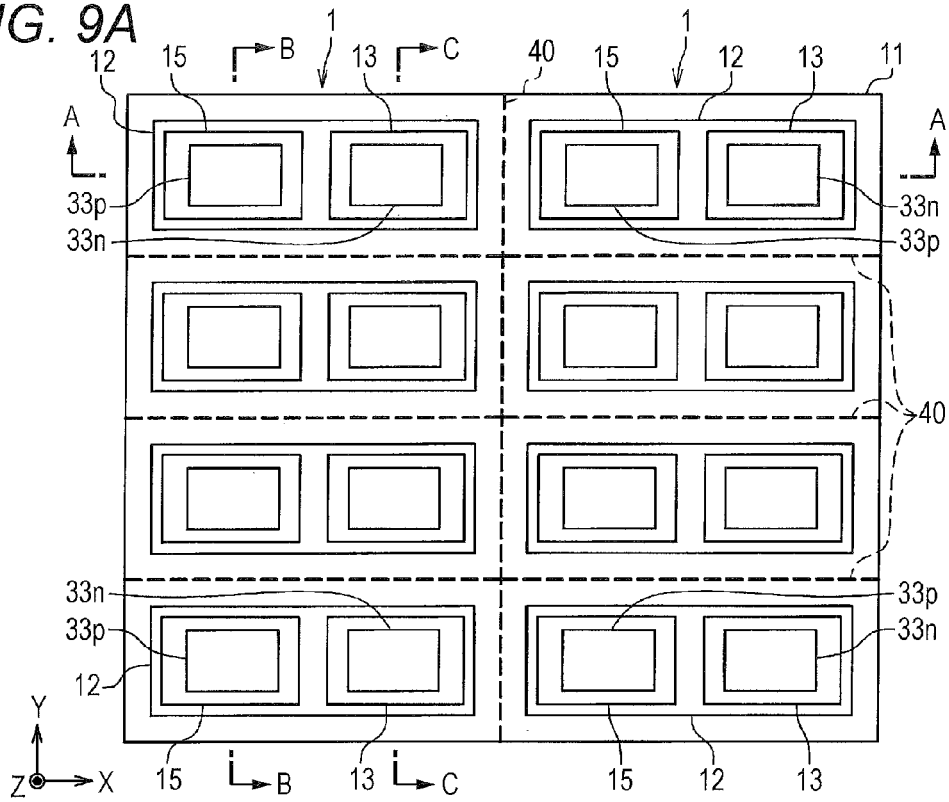
Figure 9B:
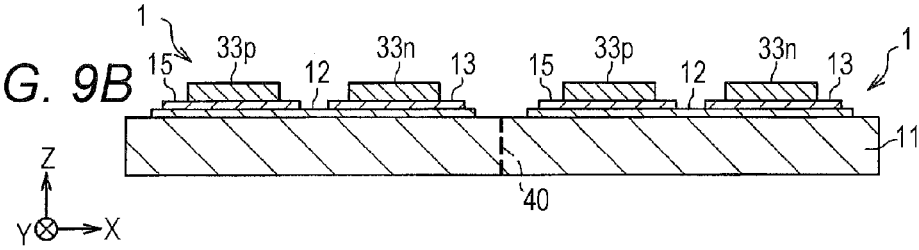
Figure 9C:
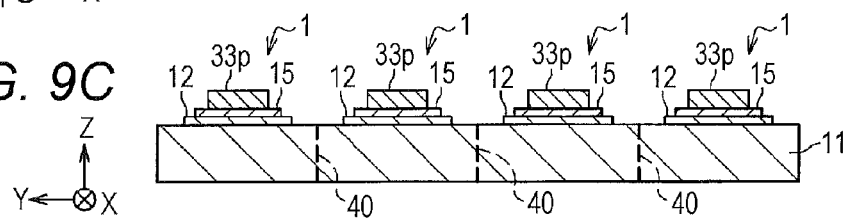
Figure 9D:
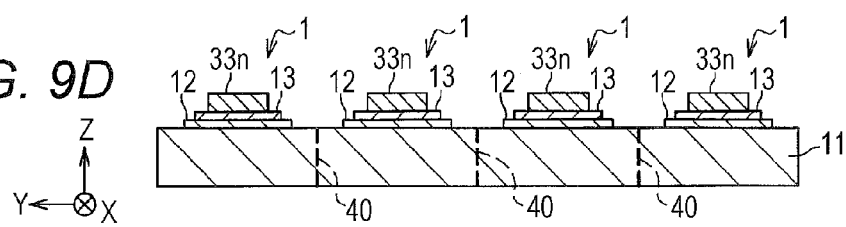
Figure 10A:
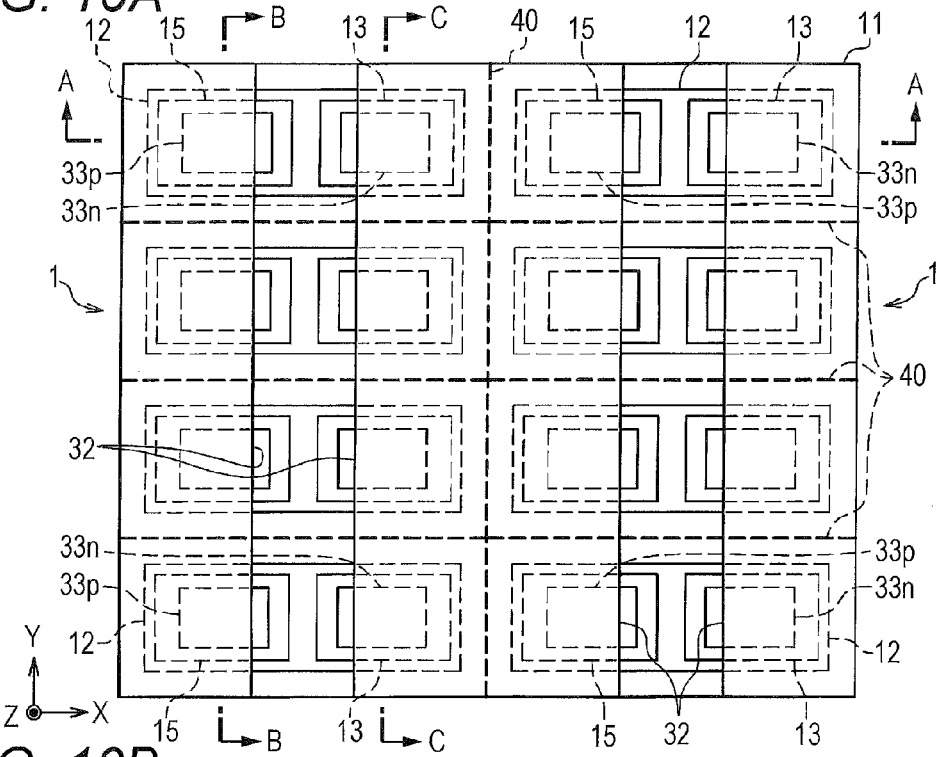
Figure 10B:
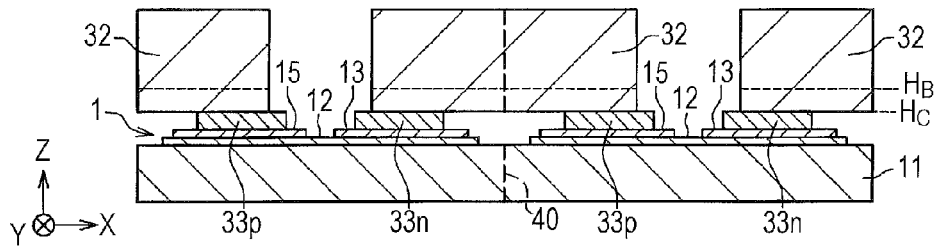
Figure 10C:
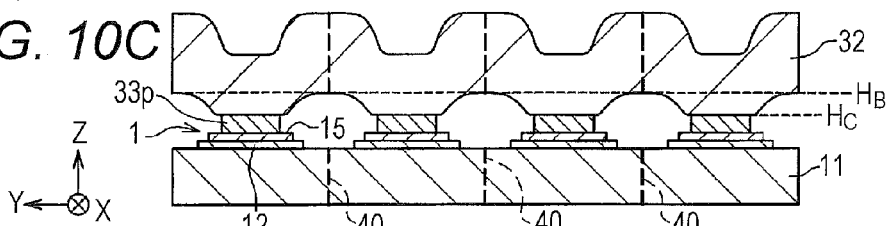
Figure 10D:
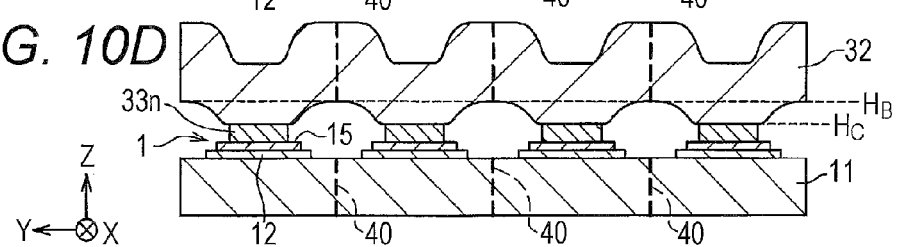

Next, a manufacturing method of the light emitting device 100 shown in FIG. 1 to FIG. 3B will be described with reference to FIG. 7. As shown in FIG. 7, the manufacturing method of the light emitting device 100 includes a light emitting element preparation step (wafer preparation step) S101, a metal layer forming step S102, a wire wiring step S103, a resin layer forming step S104, a surface machining step S105, a half-dicing step S106, an external connection electrode forming step S107, a growth substrate removal step S108, a phosphor layer forming step (wavelength conversion layer forming step) S109, and a singulation step S110, and the steps are carried out in this order. Moreover, the surface machining step S105 and the half-dicing step S106 are the step for exposing the internal wiring (internal wiring exposure step).

In the following, each step will be described in detail with reference to FIG. 8A to FIG. 18B (and with reference to FIG. 1 to FIG. 5B and FIG. 7 as appropriate). Additionally, detailed structure of the light emitting element 1 (for example, the protective layer 16, the stacked structure of the semiconductor stack 12, and the like) are omitted from each of FIG. 8A to FIG. 18B. Also, the shapes, the sizes, and the positional relationship may be simplified or exaggerated as appropriate for other members. The same thing applies to the explanatory diagrams of the manufacturing steps of other embodiments described later.

The light emitting element preparation step (wafer preparation step) S101 is a step of preparing the light emitting element 1 having the structure shown in FIGS. 4A and 4B and FIGS. 5A and 5B, for example. In the light emitting element preparation step S101, a plurality of light emitting elements 1 are formed in the form of a wafer by being arranged on one growth substrate 11. In FIG. 8A to FIG. 18B, two light emitting elements 1 are formed in the longitudinal direction (X-axis direction) and four are formed in the lateral direction (Y-axis direction) in plan view. Additionally, plan views and cross-sectional views on a plurality of planes are shown in FIG. 8A to FIG. 18B, and the direction of each figure is indicated by the coordinate axes.

Specifically, first, the semiconductor stack 12 is formed on the upper surface of the growth substrate 11 formed of sapphire or the like by sequentially stacking the n-type semiconductor layer 12n, the active layer 12a and the p-type semiconductor layer 12p using the semiconductor material described above. When the semiconductor stack 12 is formed, parts of the p-type semiconductor layer 12p, the active layer 12a and the n-type semiconductor layer 12n are removed by etching at partial regions of the upper surface of the semiconductor stack 12, and the step portion 12b having the n-type semiconductor layer 12n exposed at the bottom surface is formed.

Also, at the same time as forming the step portion 12b, the boundary region between the light emitting elements 1 may be etched to expose the n-type semiconductor layer 12n. With this process, the side surface of the semiconductor stack 12 including at least the active layer 12a can be covered by the protective layer 16 later in the light emitting element preparation step S101. Moreover, the semiconductor stack 12 may be entirely removed at the boundary region such that the growth substrate 11 is exposed. This eliminates the need of dicing the semiconductor stack 12 in the singulation step S110, and singulation may be easily performed by dicing only the layer formed of resin. Additionally, in the example shown in FIGS. 8A to 8D, the semiconductor stacks 12 at the boundary regions of the light emitting elements 1 (peripheral regions of boundary lines 40 shown by thick dotted line in each of FIGS. 8A to 8D) are entirely removed.

Next, the n-side electrode 13, which is a pad electrode, is formed on the bottom surface of the step portion 12b. Also, in the region which is to be a light emitting region including the p-type semiconductor layer 12p and the active layer 12a, the full-surface electrode 14 is formed that includes the reflective electrode 14a for covering substantially the entire upper surface of the p-type semiconductor layer 12p and the cover electrode 14b for completely covering the upper surface and the side surfaces of the reflective electrode 14a. Also, the p-side electrode 15, which is a pad electrode, is formed on a part of the upper surface of the cover electrode 14b. Furthermore, the protective layer 16 is formed on the entire surface of the wafer excluding the surfaces of the n-side electrode 13 and the p-side electrode 15 by sputtering, for example, and by using an insulating material such as SiO$_2$. The light emitting elements 1 in the wafer state are thus formed as shown in FIGS. 8A to 8D.

Next, in the metal layer forming step S102, the metal layer 33n is formed on the n-side electrode 13 and the metal layer 33p is formed on the p-side electrode 15 for each light emitting element 1, as shown in FIGS. 9A to 9D. The metal layers 33n and 33p can be formed by an electroplating method or the like, and may be shaped by a known method in the field such as a pattern formation method by etching or a pattern formation method by lift-off. Also, metal wires may be ball-bonded to the upper surfaces of the n-side electrode 13 and the p-side electrode 15 to form wire bumps, and these wire bumps may be used as the metal layers 33n and 33p.

Next, as shown in FIGS. 10A to 10D and FIG. 11, in the wire wiring step S103, wiring is performed by using a wire bonder with respect to the n-side electrodes 13 and the p-side electrodes 15 of the light emitting elements 1 arranged in one direction (Y-axis direction) on the growth substrate 11 by repeating wedge bonding using one metal wire 32 for each line (the metal wire 32 is supplied at an angle from the movement direction of a wedge tool, and is bonded by being flattened by the tip end of the wedge tool). That is, the metal wire 32 is disposed, without being cut, to be sequentially connected (commonly connected) to the electrodes arranged in one line along one direction. At this time, the metal wire 32 is disposed while being bent in a wave shape, and the portions which are parts of the side surface of the wire shape of the metal wire 32 and correspond to the troughs of the wave shape are bonded with the upper surfaces of the metal layers 33n and 33p by wedge bonding.

In other words, at the time of this bonding, the metal wire 32 is disposed to have an arc shape between the n-side electrodes 13 or the p-side electrodes 15 of the light emitting elements 1 that are adjacent to each other in the wiring direction (Y-axis direction). That is, wiring is performed in such a way that the lower end (Z-axis direction) of the metal wire 32 at the boundary line 40 of the light emitting elements 1 is at the position $H_B$, which is more separate from the semiconductor stack 12 (for example, the lower surface of the light emitting element 1 which is the light extraction surface) than the position $H_C$ of the bonding surface of the metal layer 33n or 33p.

At this time, the height of the arc of the metal wire 32 is adjusted such that the distance from the lower surface of the light emitting element 1 to the position $H_B$ is a predetermined value (for example, 100 μm) or more. Additionally, the metal layer forming step S102 may be omitted, and the metal wires 32 may be directly bonded on the n-side electrode 13 and the p-side electrode 15 without forming the metal layers 33n and 33p. Also in this case, the height of the arcs of the metal wires 32 can be adjusted such that the distance from the lower surface of the light emitting element 1 to the position $H_B$ is a predetermined value (for example, 100 μm) or more.

Additionally, the one direction (Y-axis direction) along which the light emitting elements 1 are arranged is a direction that is perpendicular to the direction (X-axis direction) along which the metal layer 33n connected to the n-side electrode 13 and the metal layer 33p connected to the p-side electrode 15 in each light emitting element 1 face each other. By wiring the metal wires 32 in this one direction, each metal wire 32 may be disposed independently without being disposed across the metal layer 33n and the metal layer 33p in one light emitting element 1.

Also, in the example shown in FIGS. 10A to 10D and FIG. 11, the metal wire 32 is disposed, with respect to the light emitting elements 1 that are arranged adjacent to each other in the direction (X-axis direction) perpendicular to the wiring direction, so as to be bonded at the same time to the metal layer 33n of one of the light emitting elements 1 and the metal layer 33p of the other light emitting element 1. That is, the metal wire 32 is disposed so as to extend, in the width direction, across the metal layer 33n of one light emitting element 1 (for example, the light emitting element 1 arranged on the left side in FIG. 10A) and the metal layer 33p of the other light emitting element 1 (for example, the light emitting element 1 arranged on the right side in FIG. 10A).

In this manner, by bonding the metal wire 32 to two metal layers 33n and 33p by performing wire bonding once, the number of times of wire bonding may be reduced. Also, using a ribbon-shaped wire having a rectangular cross-section as the metal wire 32 and wiring the ribbon-shaped wire in such a way that the long side of the rectangle extends across the metal layers 33n and 33p are preferable because the metal wire 32 may be bonded with the metal layers 33n and 33p with good adhesiveness.

Additionally, the metal wires 32 that are disposed across the light emitting elements 1 that are adjacent to each other in the wiring direction and in the direction perpendicular to the wiring direction are cut in the half-dicing step S106 or the singulation step S110 described below for each light emitting element 1. Also, in the present embodiment, a ribbon-shaped wire having a rectangular cross-section is used as the metal wire 32 to be disposed, but this is not restrictive. For example, a metal wire having a circular cross-section with a diameter corresponding to the width (the length of the long side of the cross-section) of the ribbon-shaped metal wire 32 may be used to be disposed. Also, wiring may be separately performed for the metal layers 33n and for the metal layers 33p by using a metal wire having an appropriate width or diameter instead of performing wiring across the metal layers 33n and 33p of the light emitting elements 1 that are adjacent to each other in the direction perpendicular to the wiring direction.

By forming internal wiring by using the metal wire 32 with a large volume, such as a ribbon-shaped wire or a thick wire, in the above manner, the internal wiring can be formed with less time compared to a case of forming the internal wiring by plating method, and the productivity of the light emitting device may be increased. Furthermore, the material of the metal wire 32 is not particularly limited, but by using the metal wire 32 formed of metal such as Cu or Al, which are cheaper compared to Au, internal wiring with a large volume can be provided inexpensively. As a result, the heat dissipation property of the light emitting device can be improved.

Also, by forming the metal wires 32n and 32p by bending and wiring the metal wires 32 having a large cross-sectional area, internal wiring suitable for side-view mounting may be formed by using one metal wire 32 for electrodes of each polarities. Furthermore, the internal wiring formed of this metal wire 32 may be exposed at not only the side surfaces of the resin layer 31, but also at the upper surface of the resin layer 31, and is thus suitable also for top-view mounting. Also, by wiring the metal wire 32 while bending in a wave shape, the volume of metal in the supporting member 3 (resin layer 31) after completion may be made great. Moreover, also by wiring the metal wire 32 across adjacent light emitting elements 1, the volume of metal in the supporting member 3 (resin layer 31) after completion can be made great.

Next, as shown in FIGS. 12A and 12B, in the resin layer forming step S104, the resin layer 31 is formed by a compression molding method using a mold, a coating method such as a spin-coating method, or the like in such a way as to seal the light emitting elements 1, the metal layers 33n and 33p, and the metal wires 32. At this time, the resin layer 31 is formed to have its upper surface at the position HA or higher in the Z-axis direction.

Figure 13A:
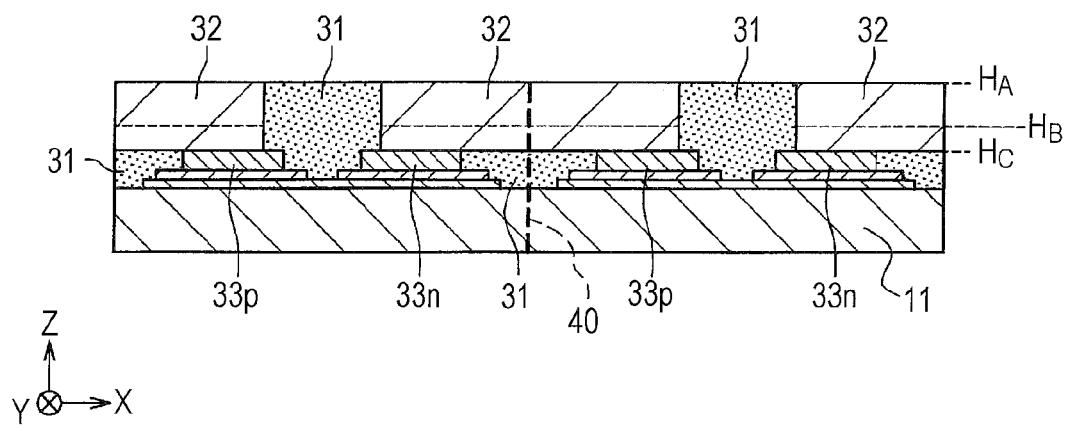
Figure 13B:
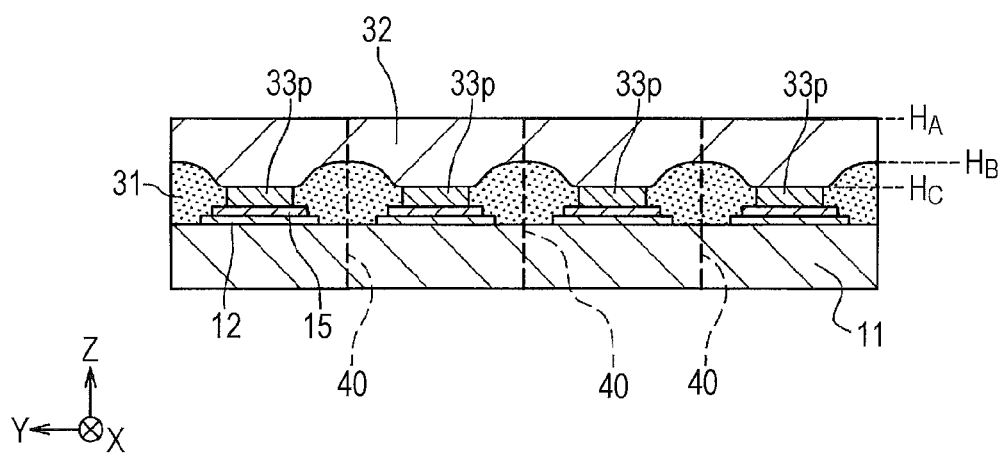

Next, in the surface machining step (internal wiring exposure step) S105, the resin layer 31 is machined from the upper surface, together with the metal wire 32 inside, down to a machining line 41 by using a machining device. Here, the height of the machining line 41 is a height corresponding to the upper surface of the trough portion of the metal wire 32 disposed in an arc shape. By machining the metal wire 32 down to this machining line 41, the metal wire 32 can be made to expose at the upper surface of the resin layer 31 and also the upper surface of the metal wire 32 can be made flat, as shown in FIGS. 13A and 13B. Also, at this time, the exposed surface of the metal wire 32 at the upper surface of the resin layer 31 and the upper surface of the resin layer are formed to have the same plane.

Figure 14A:
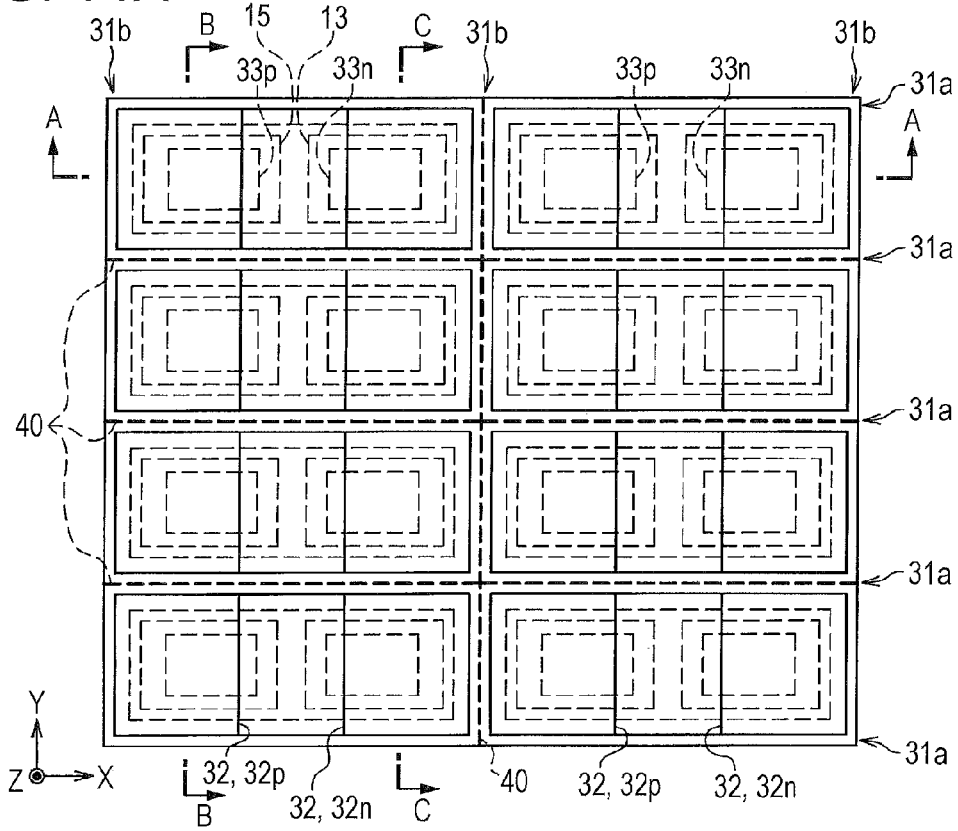
Figure 14B:
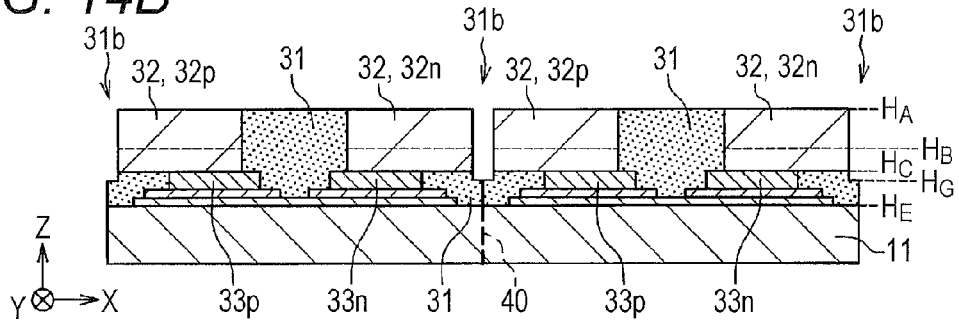
Figure 14C:
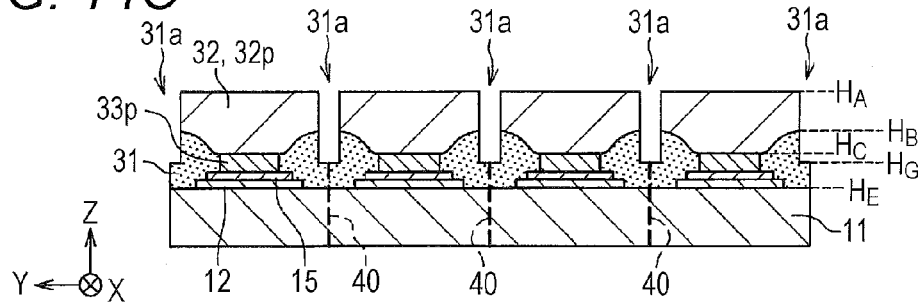

Next, as shown in FIGS. 14A to 14C, in the half-dicing step (internal wiring exposure step) S106, grooves 31a and grooves 31b are formed from the upper surface side along the boundary lines 40. The metal wire 32, which is internal wiring disposed across adjacent light emitting elements 1, is thereby cut at the part of the boundary line 40, and is separated into the metal wires 32n and 32p. Then, the end surfaces of the metal wires 32n and 32p which have been cut are exposed at respective side surfaces in the longitudinal direction and the lateral direction of the resin layer 31. Also, the inner side surface of the groove 31a is made the upper side surface of the light emitting device 100 in the longitudinal direction, and the inner side surface of the groove 31b is made the upper side surface in the lateral direction. To expose, at the side surfaces of the resin layer 31, the cut surfaces of the metal wire 32 in the manner described above as the side surfaces of the metal wires 32n and 32p, at least the groove 31a is formed by dicing (half-dicing) a part of the resin layer 31 to be removed from the upper surface side of the resin layer 31 down to a predetermined depth.

Here, the groove 31a is formed to have such a width that a plating solution sufficiently spreads over the exposed surfaces of the metal wires 32n and 32p at the time of electroless plating in the external connection electrode forming step S107 performed later. Additionally, in the half-dicing step S106, the groove 31b for forming the side surface in the lateral direction, which is not a mounting surface, may be formed by half-dicing with a different depth from that of the groove 31a, and also, instead of forming the groove 31b in the half-dicing step S106, full-dicing of completely cutting in the thickness direction along the Y-axis direction may be performed in the singulation step S110.

Here, as shown in FIGS. 14B and 14C, in the height direction (Z-axis direction), the position of the upper surfaces of the resin layer 31 and the metal wires 32n and 32p is at HA, the position of the lower end of the exposed surfaces of the metal wires 32n and 32p at the side surface in the longitudinal direction is at $H_B$, the position of the bottom surface which is the lower end of the groove 31a (and the groove 31b) formed by half-dicing is at $H_G$, and the position of the lower surface which is the lower end of the light emitting element 1 is at HE.

The lower limit (shallower limit) for a depth of the groove 31a, that is, the shallower limit for the position $H_G$, is the position $H_B$. With the position Ho being lower than the position $H_B$, the metal wire 32 may be completely cut and the cut surface may be exposed from the resin layer 31 at the side surface in the longitudinal direction. Furthermore, the position Ho is preferably at or lower than the position $H_C$, which is the lower end of the metal wires 32n and 32p. Then, the metal wires 32n and 32p may be completely cut and the cut surfaces may be exposed from the resin layer 31 also at the side surface in the lateral direction.

Also, the upper limit (deeper limit) for the position Ho is preferably at a position at which enough strength to maintain the wafer state may be obtained after the growth substrate 11 is removed in a later step. The upper limit for the position Ho may be determined as appropriate according to the rigidity of the resin. Additionally, in the case of keeping the growth substrate 11 as it is or reducing a thickness of the growth substrate 11 without removing the growth substrate 11, or in the case of attaching, after the external connection electrode forming step S107 and before removal of the growth substrate 11, an adhesive sheet, as a supporting member for maintaining the wafer state, to the surface opposite the side where the growth substrate 11 is provided, the groove 31a and the groove 31b may be formed in such a way as to remove all of the resin layer 31 in the thickness direction.

Figure 15A:
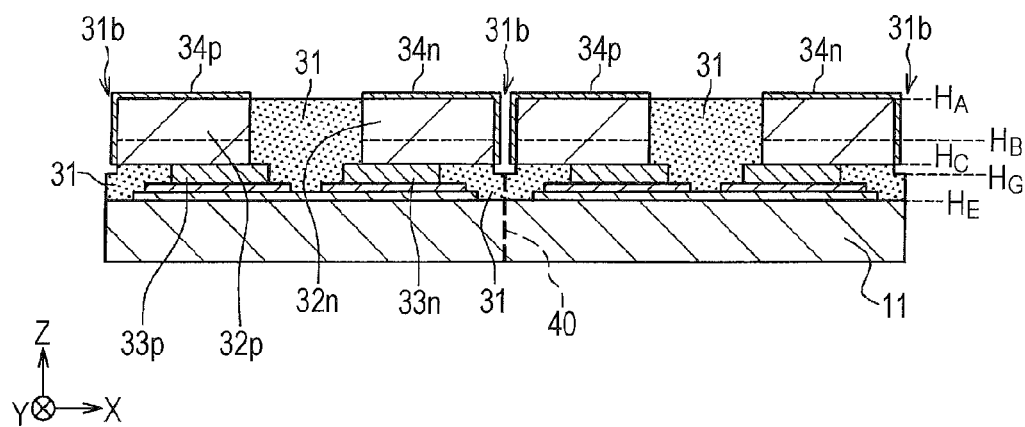
Figure 15B:
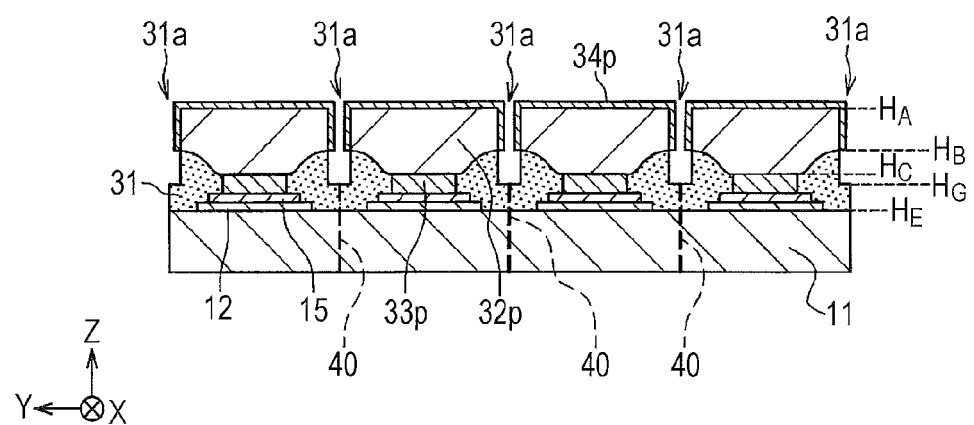

Next, as shown in FIGS. 15A and 15B, in the external connection electrode forming step S107, the external connection electrodes 34n and 34p made of Au films are formed by the electroless plating method on the exposed surfaces of the metal wires 32n and 32p at the upper surfaces and the side surfaces in the longitudinal direction and the lateral direction. Additionally, in the case where the metal wires 32n and 32p are not made of Au but made of Cu or Al, Ni films are preferably formed as lower layers before forming the Au films so as to increase the adhesiveness. In the case of providing the external connection electrodes 34n and 34p on only the exposed surfaces of the metal wires 32n and 32p in the above manner, the external connection electrodes 34n and 34p may be formed with ease by the electroless plating method. Additionally, a cross-section corresponding to line C-C in FIG. 14A is omitted from the drawings, but an n-side wiring structure is formed in a manner similar to that of the p-side wiring structure shown in FIG. 15B.

Figure 16:
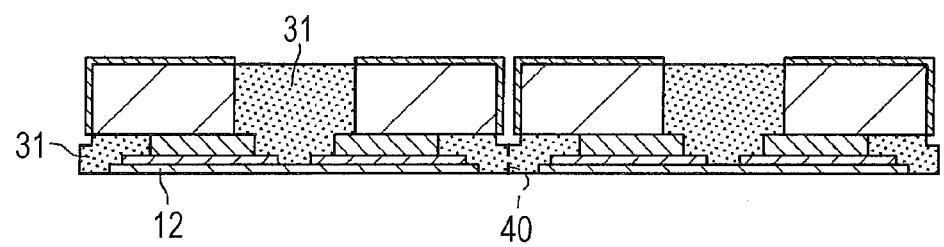
FIG. 16 is a schematic view showing a growth substrate removal step in the manufacturing steps for the light emitting device according to the first embodiment of the present invention, and is a cross-sectional view of a portion corresponding to line A-A in FIG. 14A.

Next, as shown in FIG. 16, in the growth substrate removal step S108, the growth substrate 11 is removed by an LLO (laser lift-off method) or a chemical lift-off method, for example. At this time, since the semiconductor stack 12 is reinforced by the supporting member 3 having the resin layer 31 as the main body, it may not be susceptible to damages such as splitting or cracking. Additionally, the growth substrate 11 may be thinned by rear-surface polishing instead of being removed. Also, an adhesive sheet may be attached as a supporting member for maintaining the wafer state on the upper surface side before removing the growth substrate 11.

Moreover, as post-processing after removal of the growth substrate 11, the lower surface of the semiconductor stack 12 which is exposed may be polished, and the protrusion-recess shape 12c (see FIG. 4B) may be formed by roughening the surface by a wet etching method, for example. Additionally, the growth substrate 11 which has been removed may be reused as the growth substrate 11 for allowing crystal growth of the semiconductor stack 12 by having a surface of the growth substrate 11 polished.

Figure 17:
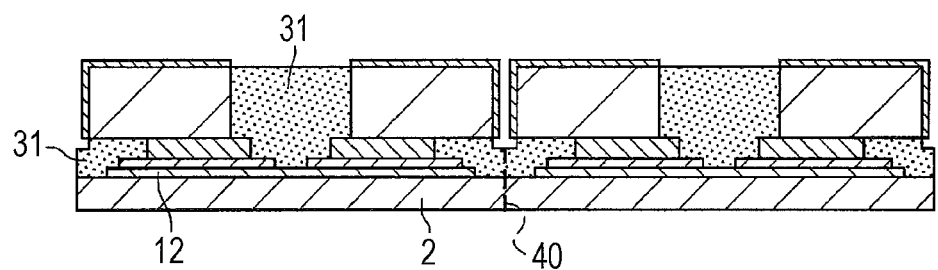
FIG. 17 is a schematic view showing a phosphor layer forming step in the manufacturing steps for the light emitting device according to the first embodiment of the present invention, and is a cross-sectional view of a portion corresponding to line A-A in FIG. 14A.

Next, as shown in FIG. 17, in the phosphor layer forming step (wavelength conversion layer forming step) S109, the phosphor layer 2 is formed on the lower surface side of the semiconductor stack 12. As described above, the phosphor layer 2 may be formed by spraying a slurry in which a solution contains a resin and phosphor particles, for example. In the case where the semiconductor stack 12 at the boundary region of the light emitting elements 1 is entirely removed in the light emitting element preparation step S101, the entire surface of the semiconductor stack 12 is to be resin-sealed by the phosphor layer 2, which is a layer formed of resin, and the resin layer 31.

Figure 18A:
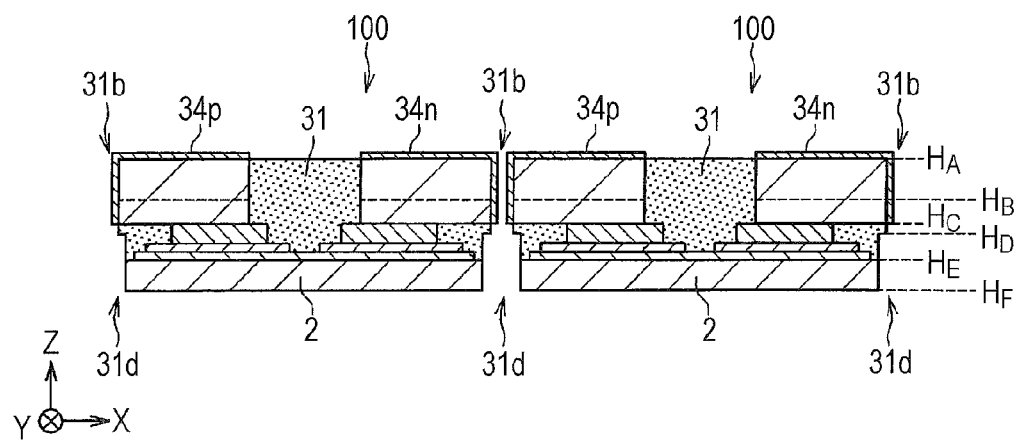
Figure 18B:
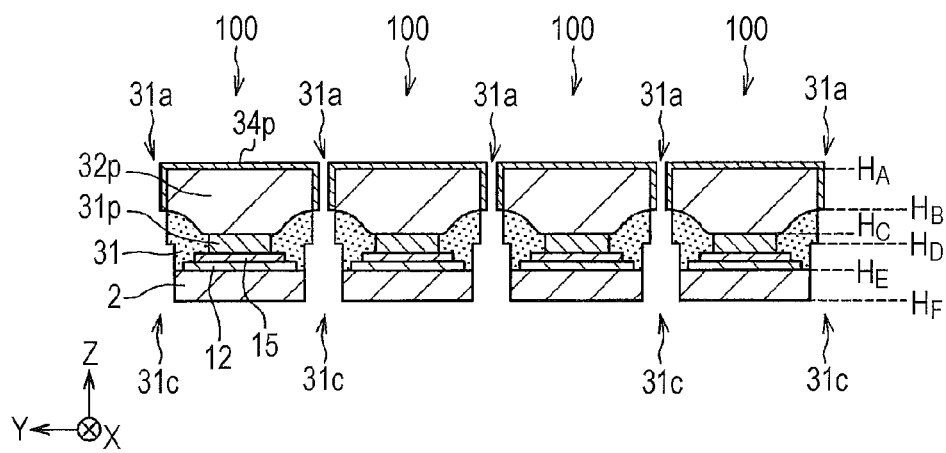

Lastly, in the singulation step S110, a groove 31c having a depth that reaches the lower surface of the groove 31a is formed as shown in FIG. 18B by dicing from the lower surface side of the phosphor layer 2 along the boundary line 40 (see FIG. 17). Also with respect to the groove 31b extending in the Y-axis direction, a groove having a depth reaching the lower surface of the groove 31b is formed as shown in FIG. 18A by dicing from the lower surface side of the phosphor layer 2. Singulation of the light emitting device 100 is performed in this manner. Additionally, in the case where the growth substrate 11 is kept without being removed, or in the case where the semiconductor stack 12 is present in the peripheral region of the boundary line 40, the growth substrate 11 and the semiconductor stack 12 are also diced.

Here, that the groove 31c reaches the lower surface of the groove 31a means that the position $H_D$ of the upper surface of the groove 31c is made the same or above the position Ho (see FIG. 14B) of the lower surface of the groove 31a. The grooves 31a and 31c are thereby communicated with each other, and thus the light emitting device 100 is separated.

Moreover, the width of the groove 31c is preferably made wider than the groove 31a, and the groove 31a is preferably formed being provided inside the groove 31c in plan view. Then, even if the center line of the groove 31a and the center line of the groove 31c are shifted from each other, singulation can be reliably performed, and moreover, a step is formed in such a way that the lower side surface of the light emitting device 100, which is the inner side surface of the groove 31c, will be on the inner side of the light emitting device 100 than the upper side surface of the light emitting device 100, which is the inner side surface of the groove 31a. Accordingly, at the side surface in the longitudinal direction, which is the mounting surface of the light emitting device 100, the lower side surface will not be on the outer side than the upper side surfaces where the external connection electrodes 34n and 34p are provided. Therefore, the adhesion between the external connection electrodes 34n and 34p and the wiring pattern of a mounting substrate or the like is not impaired by the lower side surface at the time of mounting, and the light emitting device 100 may be mounted with high reliability. Also, with the step being formed, a space is created between the mounting surface of the mounting substrate and the lower side surface of the light emitting device 100, and thus an adhesive material can be prevented from spreading to the phosphor layer 2 at the time of mounting. The light emitting device 100 shown in FIG. 1 to FIG. 3B is completed by the steps described above.

Additionally, the width of the groove 31c can be made narrower than the width of the groove 31a, and the groove 31c may be formed being provided inside the groove 31a in plan view. A step is thereby formed in such a way that the upper side surface of the light emitting device 100 is on the inner side than the lower side surface in plan view. By structuring the side surface which is the mounting surface of the light emitting device 100 in this manner, spreading of the adhesive material at the time of mounting can be prevented by the step, and thus the adhesive material can be prevented from spreading to the phosphor layer 2.

That is, with respect to the side surfaces of the resin layer 31 where the external connection electrodes 34n and 34p are provided, the lower side surfaces which are surfaces including an end portion of the side (lower surface side) where the light emitting element 1 is provided and the upper side surfaces where the external connection electrodes 34n and 34p are provided are not on the same plane, and thus an adhesive material can be prevented from spreading to the phosphor layer 2, which is the light extraction surface, at the time of mounting.

Modification Example of Manufacturing Method

Also, in the manufacturing method shown in FIG. 7, it is possible to perform the growth substrate removal step S108 and the phosphor layer forming step S109 after the resin layer forming step S104, and then perform the surface machining step S105 to the external connection electrode forming step S107. Moreover, it is also possible to perform the growth substrate removal step S108 and the phosphor layer forming step S109 after the surface machining step S105, and then perform the half-dicing step S106 and the external connection electrode forming step S107.

Moreover, in these example modifications, after the growth substrate removal step S108 and the phosphor layer forming step S109 are performed, an adhesive sheet as the supporting member for maintaining the wafer state may be attached on the side of the phosphor layer 2 and full-dicing may be performed on the resin layer 31 and the phosphor layer 2 along the boundary line 40 (see FIGS. 14A to 14C), and then the external connection electrode forming step S107 may be performed. In this case, the light emitting device 100 is already singulated by the full-dicing of the resin layer 31 and the phosphor layer 2, and thus the singulation step S110 can be omitted. Also, the step portion 31g (see FIG. 2B and FIGS. 3A and 3B) is not formed on the side surface of the resin layer 31.

Second Embodiment

Figure 19:
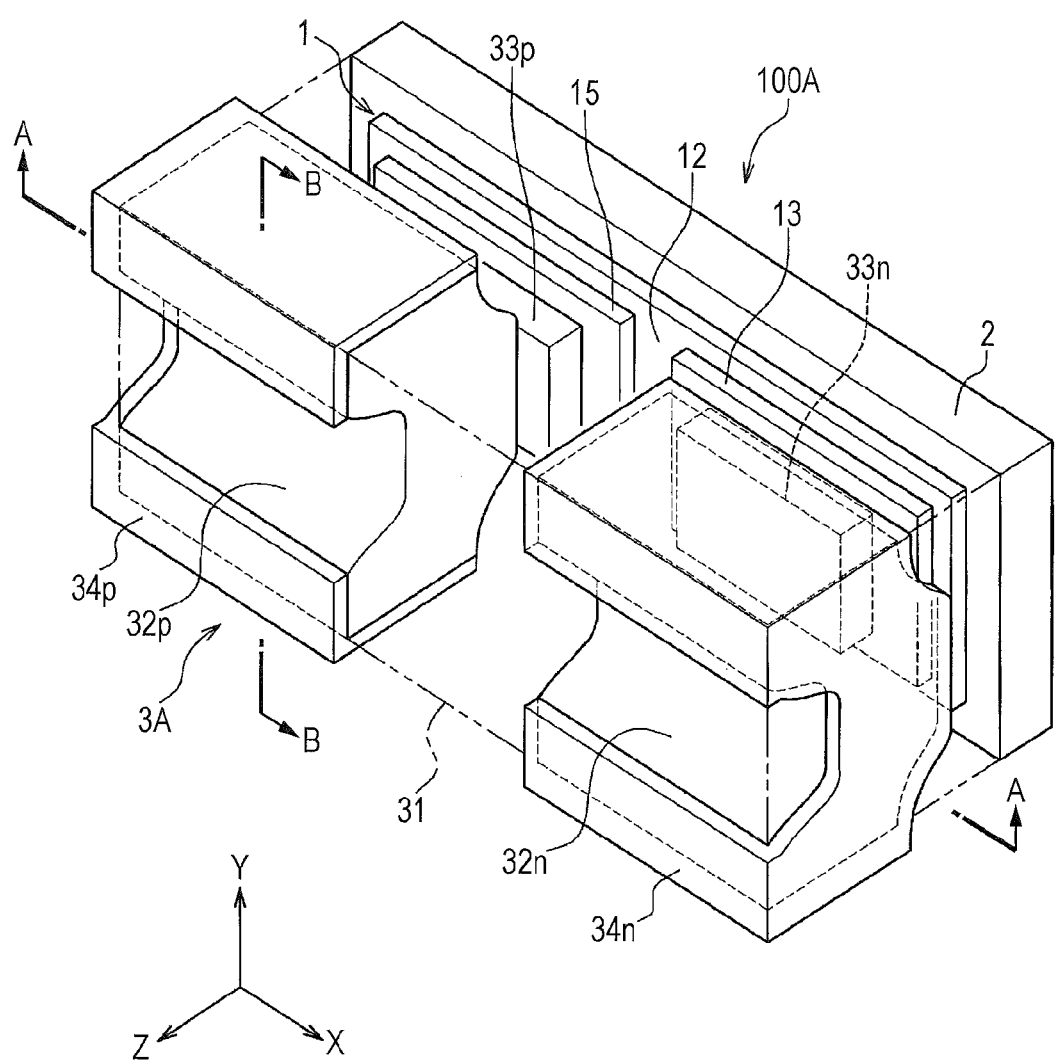
FIG. 19 is a schematic perspective view showing a structure of a light emitting device according to a second embodiment of the present invention.
Figure 20A:
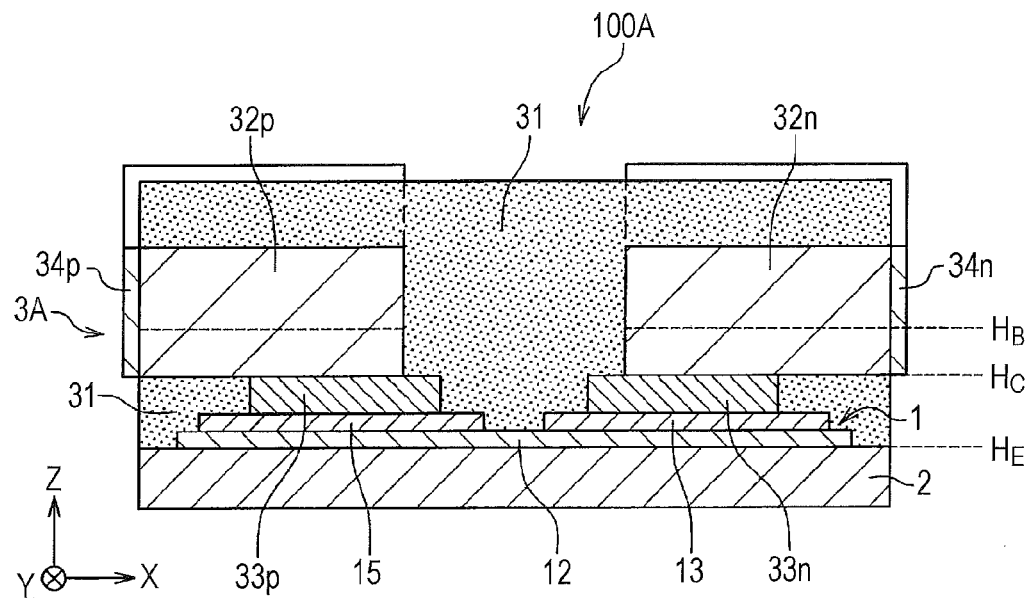
Figure 20B:
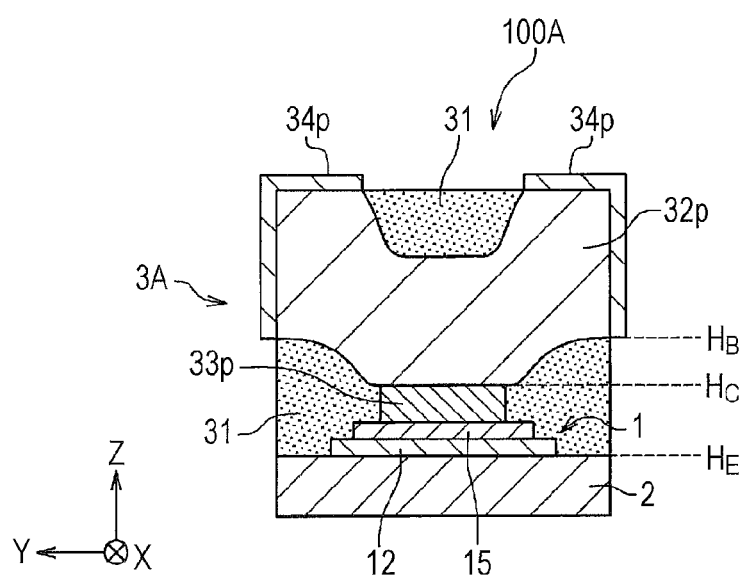

Next, a light emitting device according to a second embodiment will be described with reference to FIG. 19 and FIGS. 20A and 20B. As shown in FIG. 19 and FIGS. 20A and 20B, a light emitting device 100A according to the second embodiment is different from the light emitting device 100 according to the first embodiment shown in FIG. 1 to FIG. 3B in that a supporting member 3A is provided instead of the supporting member 3. Structures the same as those of the light emitting device 100 according to the first embodiment will be denoted by the same reference signs, and description thereof will be omitted.

In contrast to the supporting member 3 according to the first embodiment where the upper surfaces of the metal wires 32n and 32p are flat, the metal wires 32n and 32p of the supporting member 3A according to the second embodiment have the upper portions bifurcated in the lateral direction with the bifurcated top portions exposed from the resin layer 31. The bifurcated structure of the upper portions of the metal wires 32n and 32p of the supporting member 3A are formed by setting, in the surface machining step S105 of the manufacturing method according to the first embodiment, the height of the machining line 41 to be higher than the upper surface of the trough portion of the metal wire 32 disposed in an arc shape. In other words, they are formed by machining the metal wire 32 as well as the resin layer 31 to the height at which the ridge portion of the metal wire 32 disposed in an arc shape is exposed. Thus, the trough portion of the metal wire 32 disposed in an arc shape is covered by the resin layer 31. Also, the position HE of the lower end of the exposed surfaces of the metal wires 32n and 32p at the side surfaces in the longitudinal direction is the same as that in the first embodiment.

Although the upper side structure of the metal wires 32n and 32p which are the internal wiring on the upper layer side is different, the light emitting device 100A according to the second embodiment allows top-view mounting with the upper surface of the light emitting device 100A as the mounting surface. Also, as in the first embodiment, the light emitting device 100A allows side-view mounting with one of the side surfaces in the longitudinal direction as the mounting surface. Moreover, the resin layer 31 according to the second embodiment is formed to be thicker than the resin layer 31 according to the first embodiment, and thus the side surfaces of the supporting member are greater. Accordingly, the light emitting device 100A allows stable side-view mounting with this wide side surface as the mounting surface.

Additionally, the light emitting device 100A is different from the light emitting device 100 according to the first embodiment in only the shape of the metal wires 32n and 32p, which are the internal wiring, and description of the operation will be omitted. Also, as described above, the light emitting device 100A may be manufactured by changing the height of the machining line 41 in the surface machining step S105 according to the first embodiment, and detailed description regarding the manufacturing method will be omitted.

Third Embodiment

Figure 21:
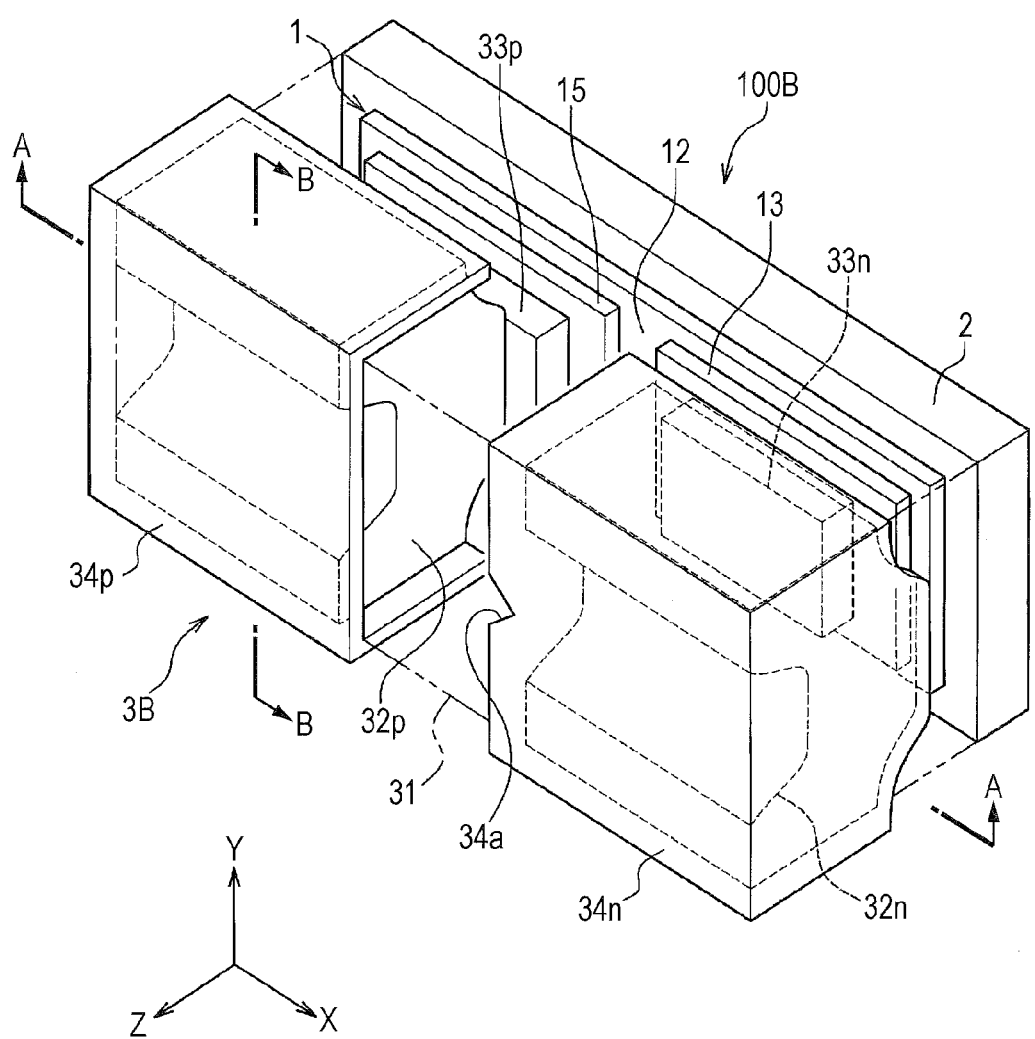
FIG. 21 is a schematic perspective view showing a structure of a light emitting device according to a third embodiment of the present invention.
Figure 22A:
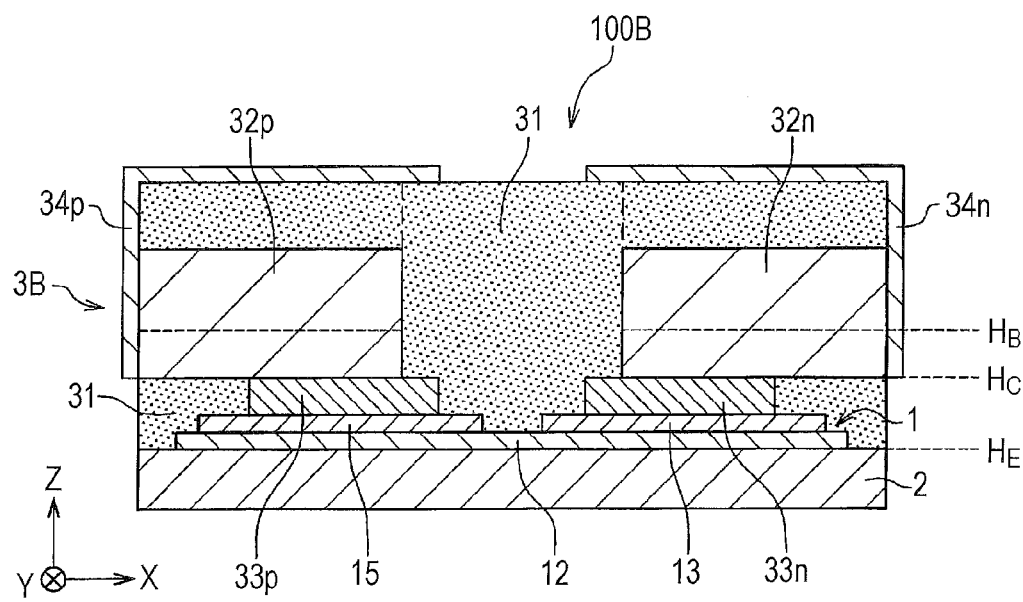
Figure 22B:
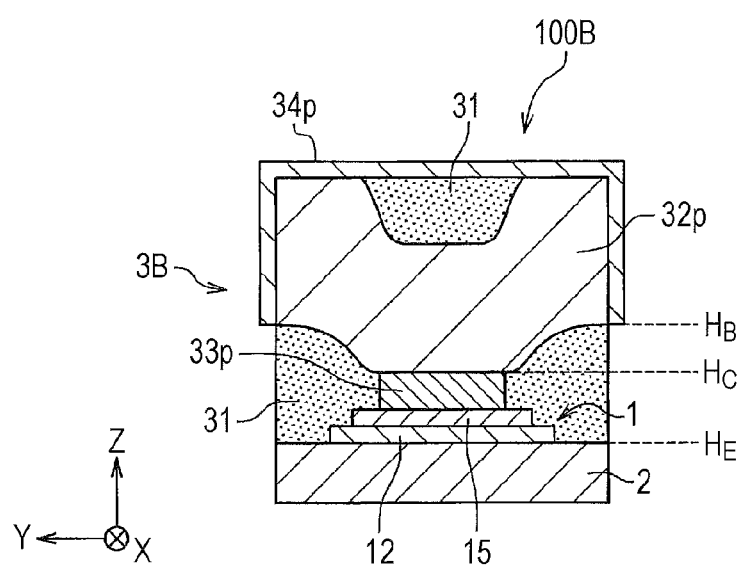

Next, a light emitting device according to a third embodiment will be described with reference to FIG. 21 and FIGS. 22A and 22B. As shown in FIG. 21 and FIGS. 22A and 22B, a light emitting device 100B according to the third embodiment is different from the light emitting device 100A according to the second embodiment shown in FIG. 19 and FIGS. 20A and 20B in that a supporting member 3B is provided instead of the supporting member 3A. Structures the same as those of the light emitting device 100A according to the second embodiment will be denoted by the same reference signs, and description thereof will be omitted.

As described above, according to the supporting member 3A of the second embodiment, the external connection electrodes 34n and 34p are provided to cover only the exposed surfaces of the metal wires 32n and 32p at the upper surface and the side surfaces. On the other hand, according to the supporting member 3B of the third embodiment, the external connection electrodes 34n and 34p are provided to extend over and cover not only the exposed surfaces of the metal wires 32n and 32p at the upper surface and the side surfaces but also the surfaces of the resin layer 31 near the exposed surfaces.

The external connection electrodes 34n and 34p are provided to cover, at the upper surface, the bifurcated exposed surfaces of the metal wires 32n and 32p exposed from the resin layer 31, and to cover, for each polarity, the upper surface of the resin layer 31 between the bifurcated exposed surfaces. Furthermore, the external connection electrodes 34n and 34p are provided to extend, at the upper surface and the side surfaces in the longitudinal direction of the resin layer 31, in a direction the external connection electrodes 34n and 34p facing each other (X-axis direction) of the metal wires 32n and 32p. Still further, the external connection electrodes 34n and 34p are provided to cover, at the side surfaces in the lateral direction, the side surfaces of the resin layer 31 corresponding to the trough portions of the arc shape of the exposed surfaces of the metal wires 32n and 32p. That is, the external connection electrodes 34n and 34p are each provided to cover, in a box shape, four surfaces at the corner of the supporting member 3B.

Also, the external connection electrode 34n includes a triangular notch 34a at a part of a side facing the external connection electrode 34p on the upper surface. This notch 34a is for identifying the polarity of a n-side electrode of the light emitting device 100B. In the present embodiment, the notch is provided to identify an n-side polarity, but instead a notch 31p may be provided to the external connection electrode 34p to indicate a p-side polarity.

As with the light emitting device 100A, the light emitting device 100B allows top-view mounting with the upper surface as the mounting surface, and also allows side-view mounting with one of the side surfaces in the longitudinal direction as the mounting surface. Moreover, in the case of top-view mounting, since the external connection electrodes 34n and 34p are provided on the upper surface, which is the mounting surface, to extend over the upper surface of the resin layer 31, the external connection electrodes 34n and 34p are able to bond with the mounting substrate more strongly than in the light emitting device 100A. Furthermore, heat generated by the light emitting element 1 may be efficiently transferred to the outside via the external connection electrodes 34n and 34p provided over a wider area, and the heat dissipation property can be improved. The operation of the light emitting device 100B is similar to that of the light emitting device 100 and the like described above, and description thereof will be omitted.

The light emitting device 100B according to the third embodiment can be manufactured by forming the external connection electrodes 34n and 34p, in the external connection electrode forming step S107 in the manufacturing method of the light emitting device 100A according to the second embodiment described above, by a sputtering method using a resist pattern instead of the electroless plating method. The light emitting element preparation step S101 to the half-dicing step S106 are carried out in the same manner as in the second embodiment. That is, the metal wires 32n and 32p are exposed at the upper surface and the side surfaces of the resin layer 31 by performing the surface machining step S105 and the half-dicing step S106.

Next, in the external connection electrode forming step S107, a resist pattern having openings at regions where the external connection electrodes 34n and 34p are to be provided at the upper surface and the side surfaces and masking other regions is formed, and then a metal film is formed by the sputtering method. Then, by removing (lifting off) the resist pattern, patterning of the external connection electrodes 34n and 34p is performed. At this time, a metal film is formed as the external connection electrodes 34n and 34p on the exposed surfaces of the metal wires 32n and 32p and the peripheral surface therearound of a predetermined area on the resin layer 31. Also, by further performing electroless plating after patterning of this metal film, strong external connection electrodes 34n and 34p can be formed.

Additionally, to form a resist pattern on the inner surfaces of the grooves 31a and 31b formed in the half-dicing step S106, a coating device (for example, Q-jet (registered trademark) series of Engineering System Co., Ltd.) can be suitably used that allows for highly accurate coating by ejecting a high-viscosity resist material by an electrostatic ejection method. The resist pattern can also be formed by using a photolithography method.

By forming the external connection electrodes 34n and 34p by a sputtering method using a resist pattern, which is a mask, in combination as described above, the external connection electrodes 34n and 34p can be formed over a wide area to extend over the side surfaces and the upper surface of the resin layer 31, in addition to the exposed surfaces of the metal wires 32n and 32p, which are the internal wiring.

The growth substrate removal step S108 to the singulation step S110 are similar to those in the second embodiment, and description thereof will be omitted.

Fourth Embodiment

Figure 23:
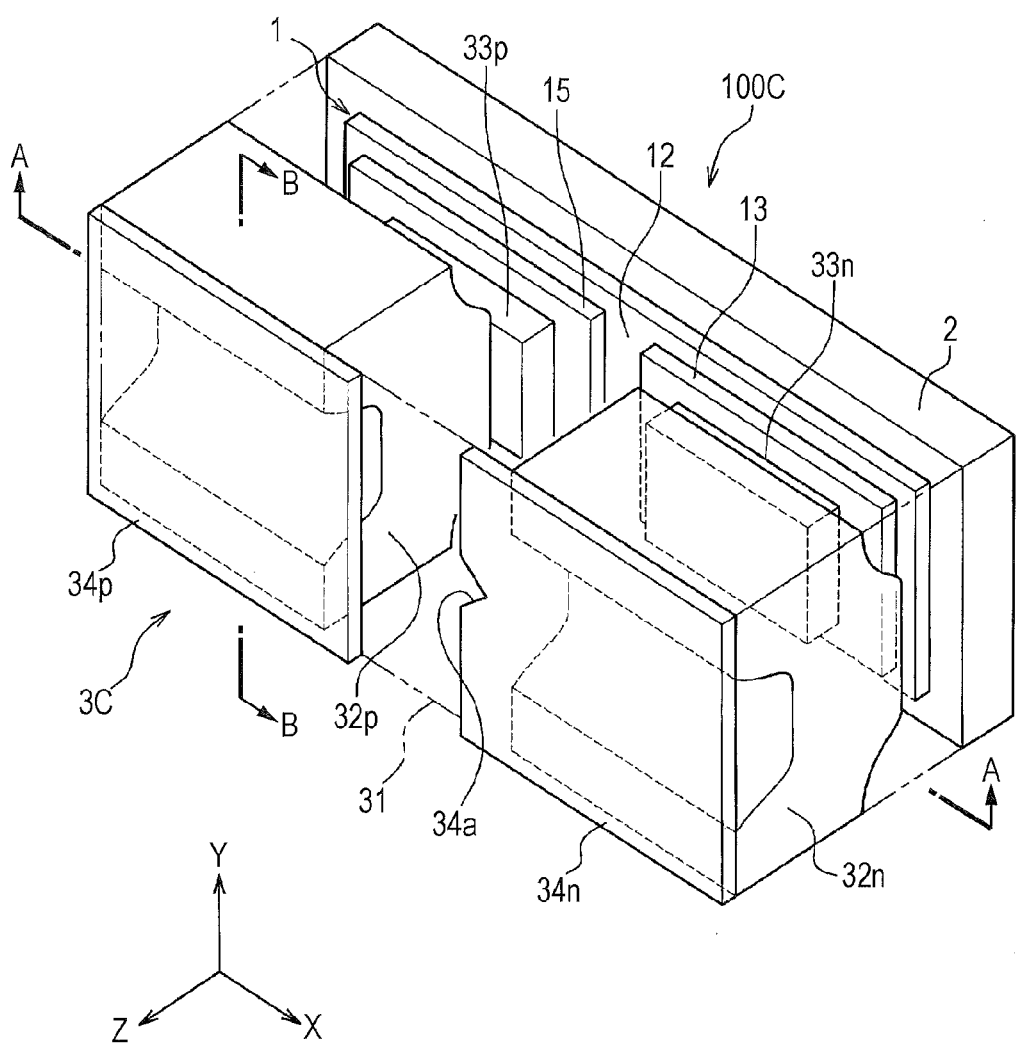
FIG. 23 is a schematic perspective view showing a structure of a light emitting device according to a fourth embodiment of the present invention.
Figure 24A:
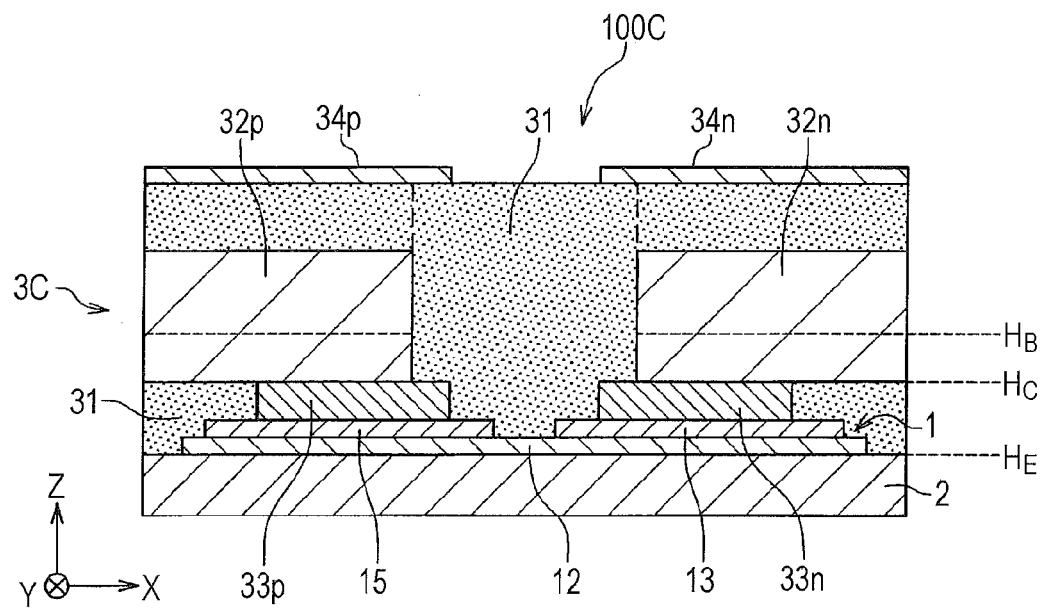
Figure 24B:
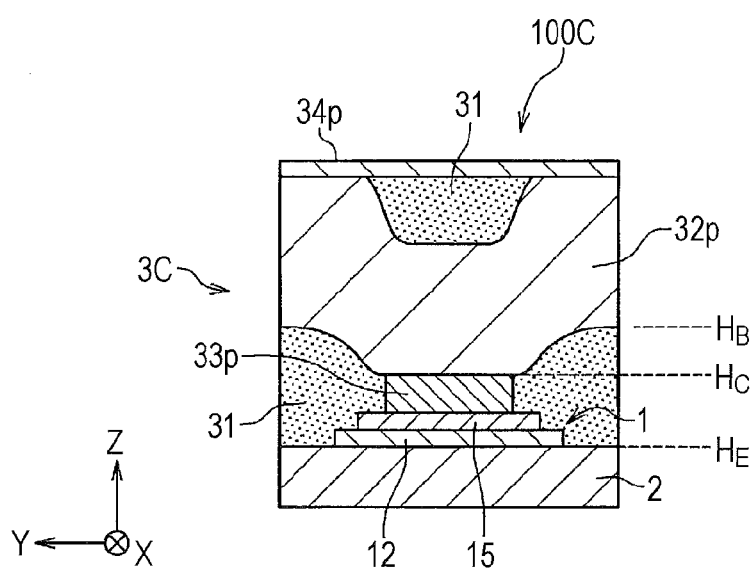

Next, a light emitting device according to a fourth embodiment will be described with reference to FIG. 23 and FIGS. 24A and 24B. As shown in FIG. 23 and FIGS. 24A and 24B, a light emitting device 100C according to the fourth embodiment is different from the light emitting device 100B according to the third embodiment shown in FIG. 21 and FIGS. 22A and 22B in that a supporting member 3C is provided instead of the supporting member 3B. Structures the same as those of the light emitting device 100B according to the third embodiment will be denoted by the same reference signs, and description thereof will be omitted.

As described above, according to the supporting member 3B of the third embodiment, the external connection electrodes 34n and 34p are provided to extend over and cover the exposed surfaces of the metal wires 32n and 32p at the upper surface and the side surfaces and the surface of the resin layer 31 near these exposed surfaces. On the other hand, according to the supporting member 3C of the fourth embodiment, the external connection electrodes 34n and 34p are provided to extend over and cover the exposed surfaces of the metal wires 32n and 32p at the upper surface and the surface of the resin layer 31 near these exposed surfaces. Accordingly, the external connection electrodes 34n and 34p are not provided at the side surfaces in the longitudinal direction and the lateral direction, and the metal wires 32n and 32p remain exposed from the resin layer 31.

Accordingly, the present embodiment has a structure suitable for top-view mounting with the upper surface as the mounting surface. Also, although the external connection electrodes 34n and 34p are not provided on the side surfaces in the longitudinal direction, side-view mounting can also be performed with the exposed surfaces of the metal wires 32n and 32p at the side surfaces in the longitudinal direction as bonding sections. As in the present embodiment, it is possible to provide the external connection electrodes 34n and 34p at only the necessary regions by taking the manner of mounting into account. The operation of the light emitting device 100C is similar to that of the light emitting device 100 and the like described above, and description thereof will be omitted.

The light emitting device 100C according to the fourth embodiment can be manufactured by the manufacturing method of the light emitting device 100B according to the third embodiment described above without the half-dicing step S106. That is, after causing the upper surfaces of the metal wires 32n and 32p to be exposed in the surface machining step S105, the external connection electrode forming step S107 is performed to thereby form the external connection electrodes 34n and 34p only at the upper surface. Also, in the fourth embodiment, the light emitting device 100C can be singulated by performing full-dicing on the resin layer 31 and the phosphor layer 2 along the boundary line 40 (for example, see FIGS. 8A to 8D) in the singulation step S110. Other steps are the same as those of the third embodiment, and description thereof will be omitted.

Fifth Embodiment

Figure 25:
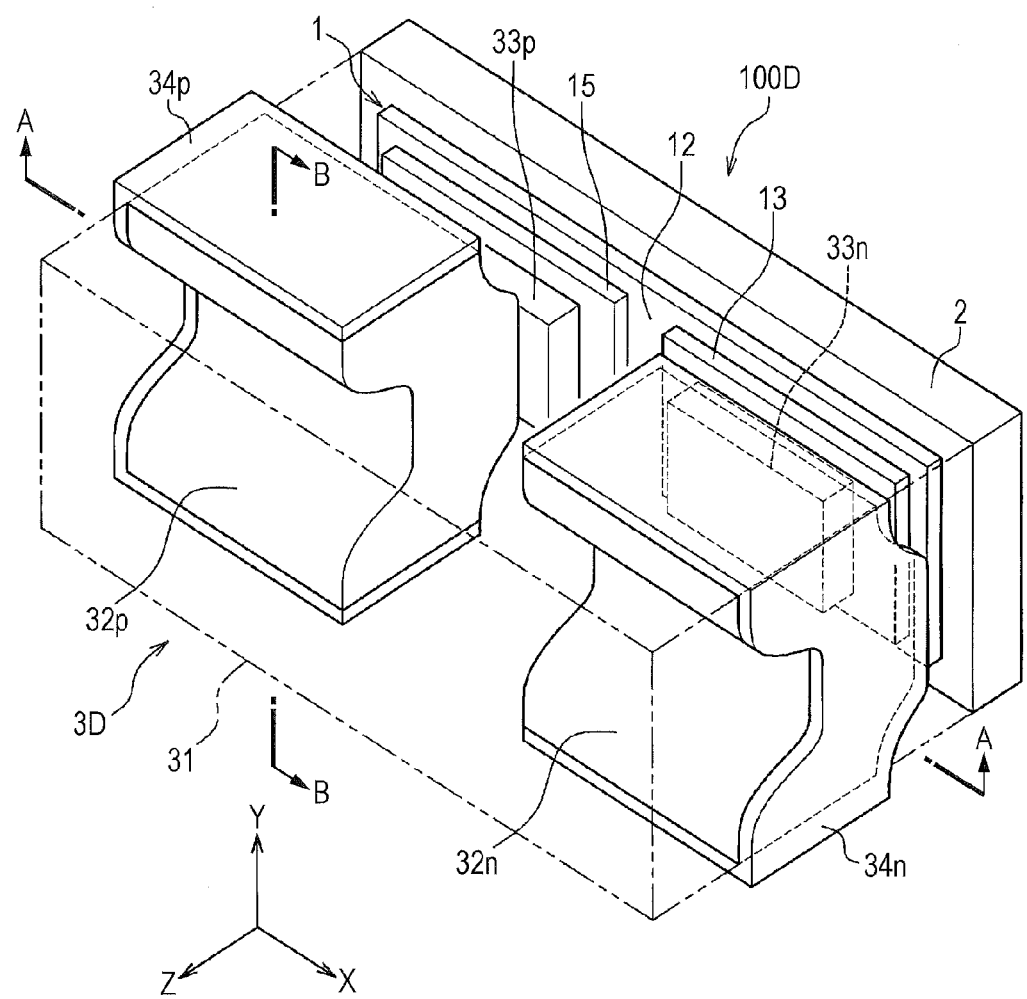
FIG. 25 is a schematic perspective view showing a structure of a light emitting device according to a fifth embodiment of the present invention.
Figure 26A:
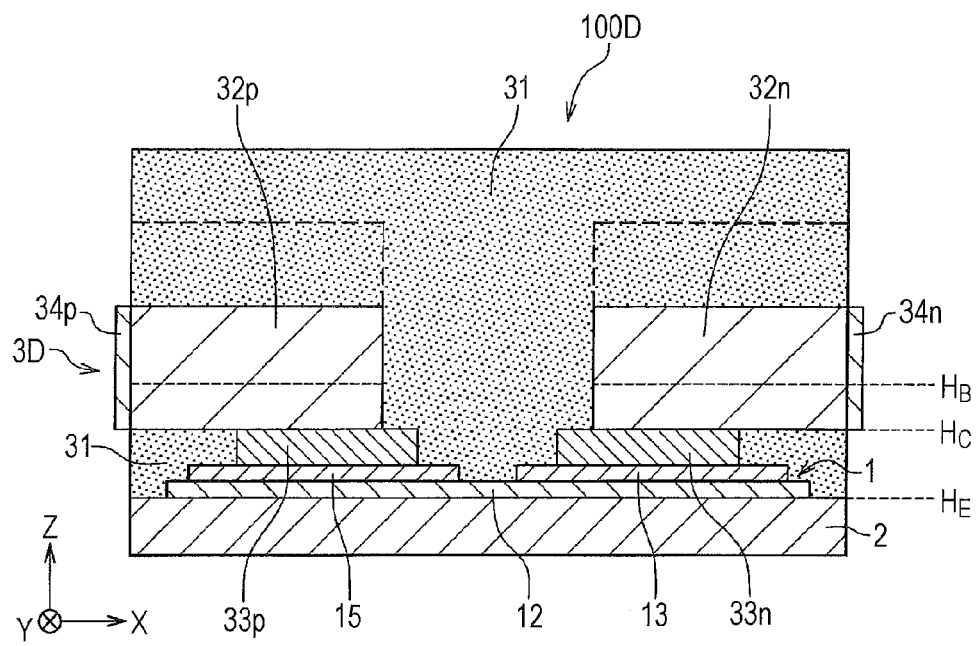
Figure 26B:
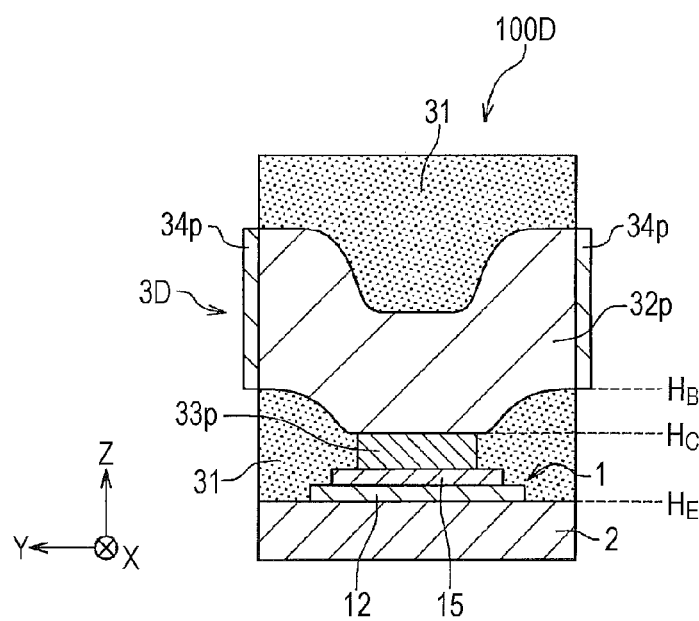

Next, a light emitting device according to a fifth embodiment will be described with reference to FIG. 25 and FIGS. 26A and 26B. As shown in FIG. 25 and FIGS. 26A and 26B, a light emitting device 100D according to the fifth embodiment is different from the light emitting device 100A according to the second embodiment shown in FIG. 19 and FIGS. 20A and 20B in that a supporting member 3D is provided instead of the supporting member 3A. Structures the same as those of the light emitting device 100A according to the second embodiment will be denoted by the same reference signs, and description thereof will be omitted.

According to the supporting member 3A of the second embodiment, the external connection electrodes 34n and 34p are provided to cover the exposed surfaces of the metal wires 32n and 32p at the upper surface and the side surfaces as described above. On the other hand, according to the supporting member 3D of the fifth embodiment, the entire upper surfaces of the metal wires 32n and 32p are covered by the resin layer 31. The external connection electrodes 34n and 34p are provided to cover only the exposed surfaces of the metal wires 32n and 32p at the side surfaces in the longitudinal direction and the lateral direction.

Accordingly, the supporting member 3D of the fifth embodiment has a structure suitable for side-view mounting with one of the side surfaces in the longitudinal direction as the mounting surface. By forming a thick resin layer 31, the side surfaces may be formed to be wide, and more stable side-view mounting is allowed with a wide side surface in the longitudinal direction as the mounting surface. The operation of the light emitting device 100D is similar to that of the light emitting device 100 and the like described above, and description thereof will be omitted.

The light emitting device 100D according to the fifth embodiment can be manufactured by the manufacturing method of the light emitting device 100A according to the second embodiment described above without the surface machining step S105. Alternatively, it is also possible to perform surface-machining in the surface machining step S105 to adjust the height of the resin layer 31 within a range where the upper surfaces of the metal wires 32n and 32p are not exposed. Also, in the external connection electrode forming step S107, the external connection electrodes 34n and 34p may be formed only at the exposed surfaces of the metal wires 32n and 32p that are exposed at the side surfaces of the resin layer 31 by the electroless plating method. Other steps are the same as those of the second embodiment, and description thereof will be omitted.

Sixth Embodiment

Figure 27:
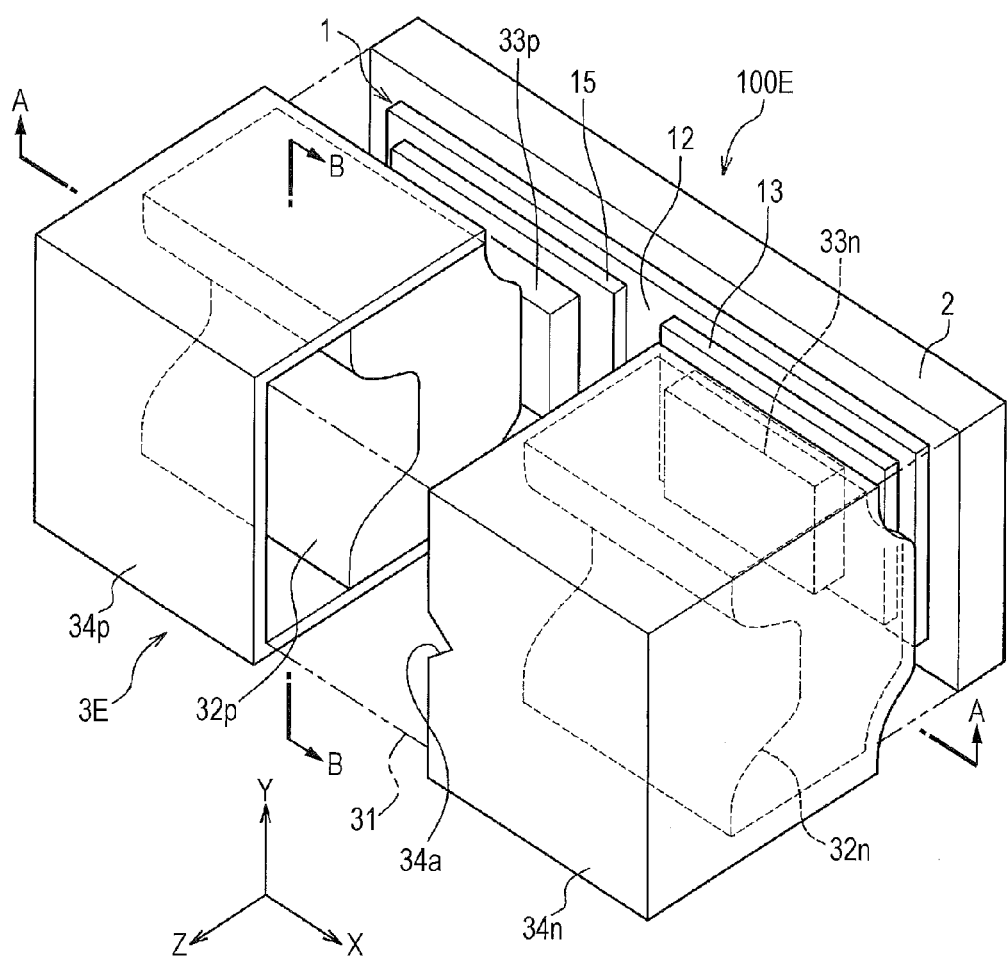
FIG. 27 is a schematic perspective view showing a structure of a light emitting device according to a sixth embodiment of the present invention.
Figure 28A:
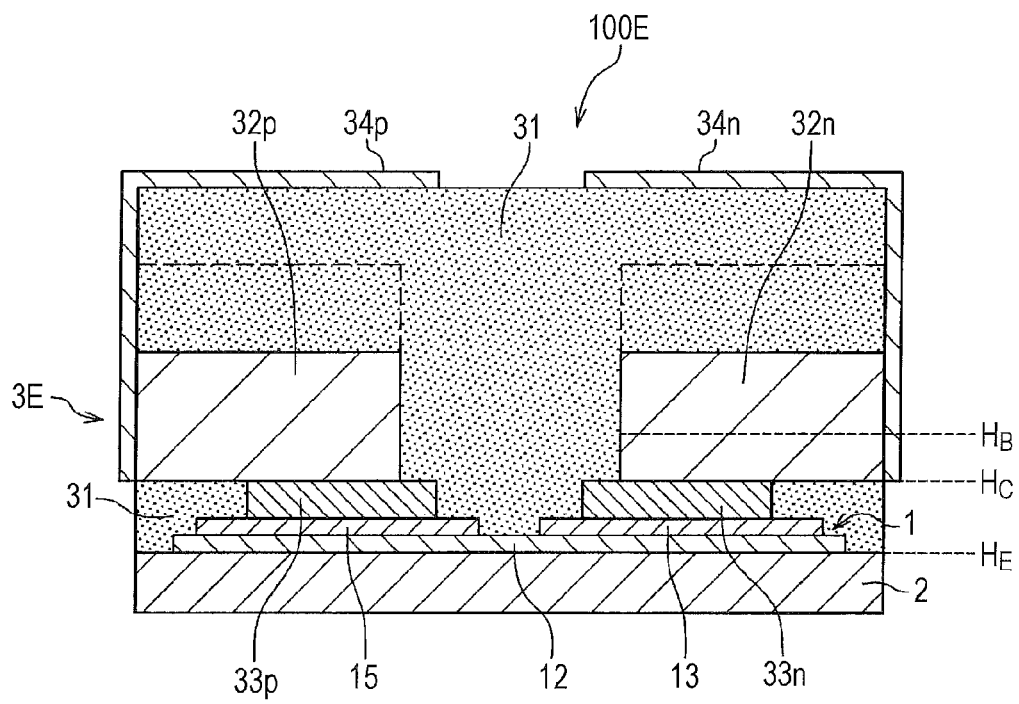
Figure 28B:
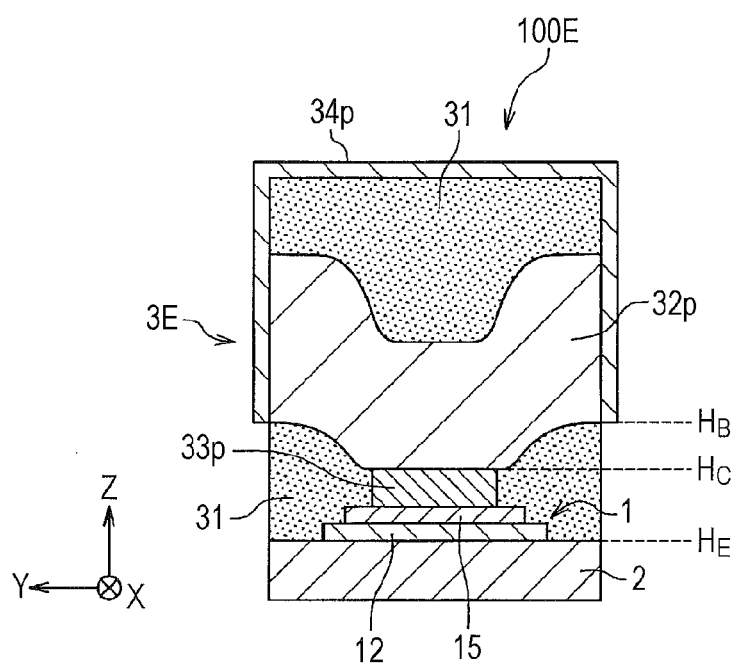

Next, a light emitting device according to a sixth embodiment will be described with reference to FIG. 27 and FIGS. 28A and 28B. As shown in FIG. 27 and FIGS. 28A and 28B, a light emitting device 100E according to the sixth embodiment is different from the light emitting device 100D according to the fifth embodiment shown in FIG. 25 and FIGS. 26A and 26B in that a supporting member 3E is provided instead of the supporting member 3D. Structures the same as those of the light emitting device 100D according to the fifth embodiment will be denoted by the same reference signs, and description thereof will be omitted.

As described above, according to the supporting member 3D of the fifth embodiment, the entire upper surfaces of the metal wires 32n and 32p are covered by the resin layer 31, and the external connection electrodes 34n and 34p are provided to cover only the exposed surfaces of the metal wires 32n and 32p at the side surfaces in the longitudinal direction and the lateral direction. On the other hand, according to the supporting member 3E of the sixth embodiment, the external connection electrodes 34n and 34p are provided to extend over the exposed surfaces of the metal wires 32n and 32p at the side surfaces in the longitudinal direction and the lateral direction, and also extend to the entire surface of the resin layer 31 higher than these exposed surfaces and the upper surface. Accordingly, the light emitting device 100E is structured to enable top-view mounting with the upper surface as the mounting surface as well as side-view mounting with one of the side surfaces in the longitudinal direction as the mounting surface. The operation of the light emitting device 100E is similar to that of the light emitting device 100 and the like described above, and description thereof will be omitted.

The light emitting device 100E according to the sixth embodiment can be manufactured by the manufacturing method of the light emitting device 100B according to the third embodiment described above without the surface machining step S105. Alternatively, it is also possible to perform surface-machining in the surface machining step S105 to adjust the height of the resin layer 31 within a range where the upper surfaces of the metal wires 32n and 32p are not exposed. Also, in the external connection electrode forming step S107, the external connection electrodes 34n and 34p can be formed, by a sputtering method using a resist pattern, to extend over the exposed surfaces of the metal wires 32n and 32p that are exposed at the side surfaces of the resin layer 31, and also over the surface of the resin layer higher than these exposed surfaces and the upper surface. Other steps are the same as those of the third embodiment, and description thereof will be omitted.

Seventh Embodiment

Figure 29:
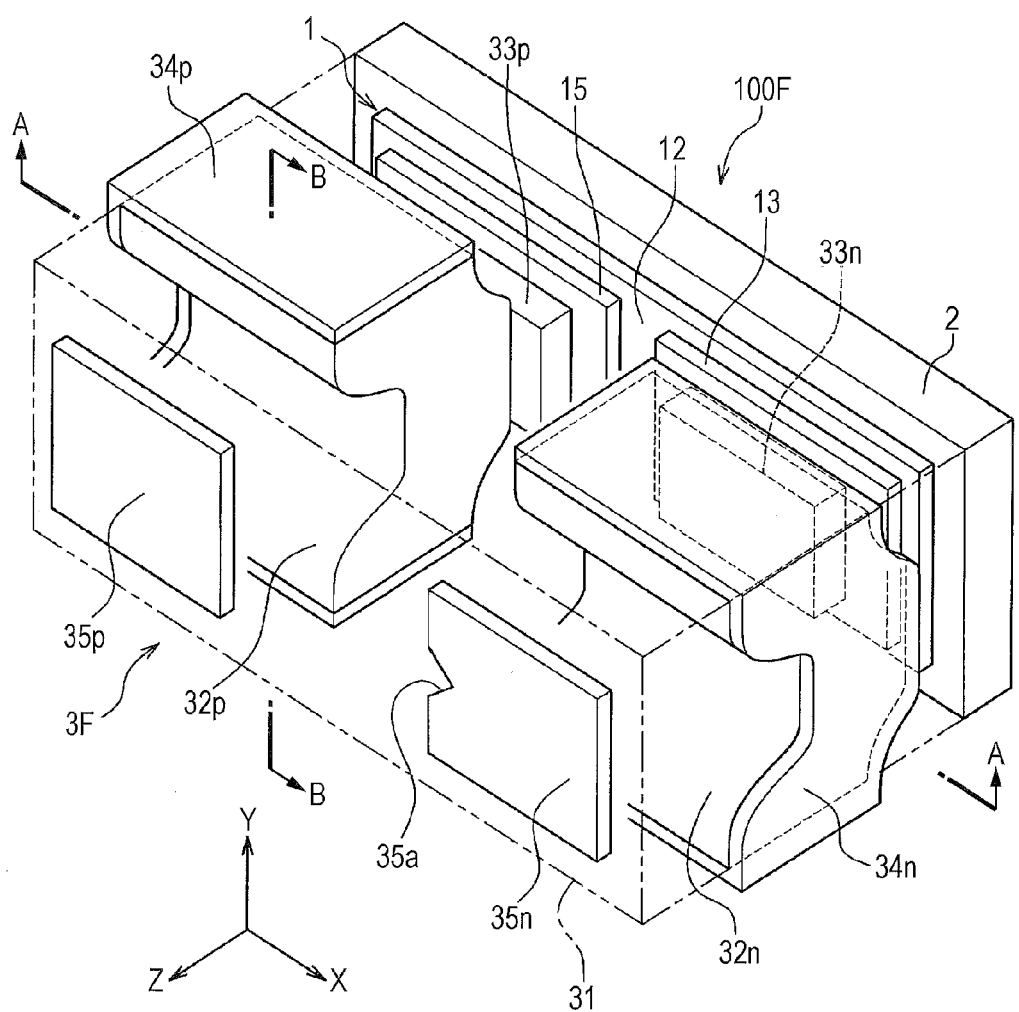
FIG. 29 is a schematic perspective view showing a structure of a light emitting device according to a seventh embodiment of the present invention.
Figure 30A:
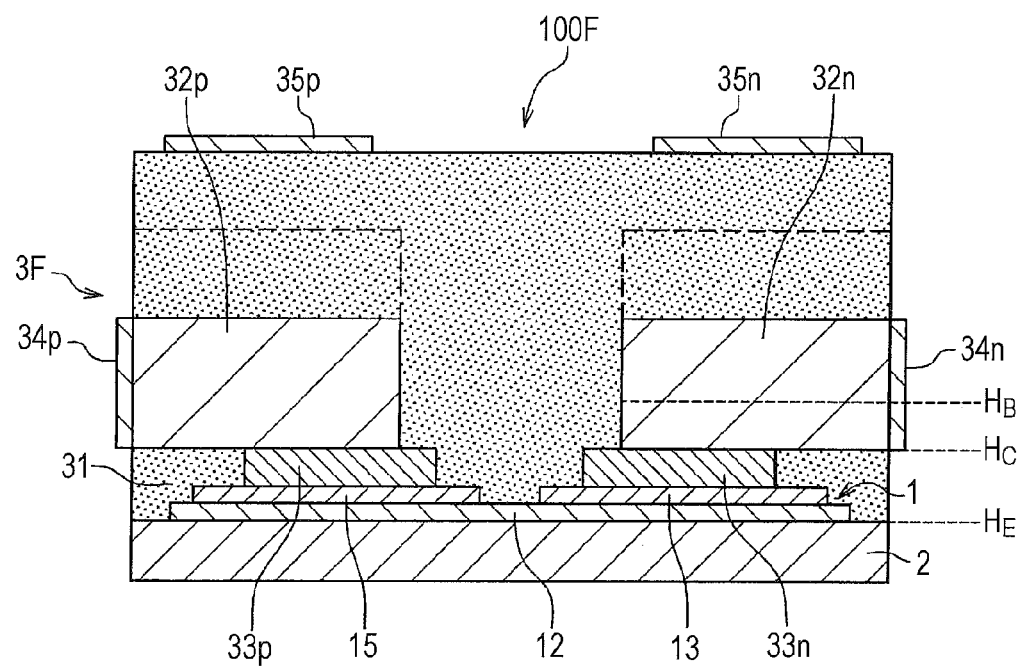
Figure 30B:
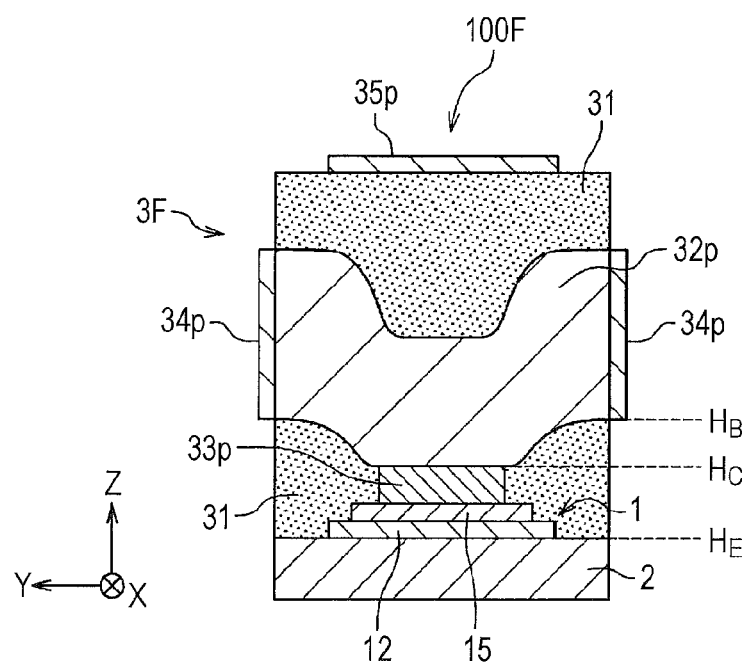

Next, a light emitting device according to a seventh embodiment will be described with reference to FIG. 29 and FIGS. 30A and 30B. As shown in FIG. 29 and FIGS. 30A and 30B, a light emitting device 100F according to the seventh embodiment is different from the light emitting device 100D according to the fifth embodiment shown in FIG. 25 and FIGS. 26A and 26B in that a supporting member 3F is provided instead of the supporting member 3D. Structures the same as those of the light emitting device 100D according to the fifth embodiment will be denoted by the same reference signs, and description thereof will be omitted.

As described above, according to the supporting member 3D of the fifth embodiment, the entire upper surfaces of the metal wires 32n and 32p are covered by the resin layer 31, and the external connection electrodes 34n and 34p are provided to cover only the exposed surfaces of the metal wires 32n and 32p at the side surfaces in the longitudinal direction and the lateral direction. On the other hand, according to the supporting member 3F of the seventh embodiment, the external connection electrodes 34n and 34p are provided to cover the exposed surfaces of the metal wires 32n and 32p at the side surfaces in the longitudinal direction and the lateral direction, and also metal films 35n and 35p are provided on the upper surface. The metal films 35n and 35p provided on the upper surface are not electrically conducted with the external connection electrodes 34n and 34p and the metal wires 32n and 32p, and are electrically floating metal films.

Accordingly, the light emitting device 100F has a structure that is suitable for side-view mounting with one of the side surfaces in the longitudinal direction as the mounting surface. Also, by forming a thick resin layer 31, the light emitting device 100F may be stably bonded to the mounting substrate at the time of side-view mounting. Furthermore, with an adhesive material that is supplied to the external connection electrodes 34n and 34p provided on the side surfaces in the longitudinal direction extending over the surface of the resin layer 31 to the metal films 35n and 35p formed on the upper surface at the time of side-view mounting, the bondability can be increased. For this reason, the metal films 35n and 35p are preferably provided to extend to regions within a predetermined distance (for example, 100 μm) from the side surface in the longitudinal direction.

Additionally, as with the notch 34a (for example, see FIG. 27), a triangular notch 35a formed at one side of the metal film 35n is for identifying that the external connection electrode 34n provided near the notch 35a is of an n-side polarity. The operation of the light emitting device 100F is similar to that of the light emitting device 100 and the like described above, and description thereof will be omitted.

The light emitting device 100F according to the seventh embodiment can be manufactured by changing the manufacturing method of the light emitting device 100D according to the fifth embodiment in the following manner. That is, the metal films 35n and 35p are formed on the upper surface by a sputtering method using a resist pattern before the half-dicing step S106. Then, the half-dicing step S106 is performed to cause the metal wires 32n and 32p to be exposed at the side surfaces of the resin layer 31, and by performing electroless plating in the external connection electrode forming step S107, the external connection electrodes 34n and 34p are formed on the exposed surfaces of the metal wires 32n and 32p. The metal films 35n and 35p can be made strong by the electroless plating at this time. Other steps are the same as those of the fifth embodiment, and description thereof will be omitted.

Furthermore, the light emitting device 100F can be formed by the same manufacturing method as the light emitting device 100E according to the sixth embodiment. In this case, a resist pattern is formed in the external connection electrode forming step S107 in such a way as to mask regions between the metal films 35n, 35p and the external connection electrodes 34n, 34p to thereby form electrically floating metal films 35n and 35p.

Example Modification

The following structures are also allowed with respect to the light emitting devices 100 to 100F according to the embodiments described above. The metal wires 32n and 32p may be directly bonded on the n-side electrode 13 and the p-side electrode 15 without the metal layers 33n and 33p being provided. Also, the exposed surfaces of the metal wires 32n and 32p from the resin layer 31 may be made the bonding sections for external connection without the external connection electrodes 34n and 34p being provided. Furthermore, the external connection electrodes 34n and 34p may be provided to cover all or a part of the surfaces of the metal wires 32n and 32p exposed from the resin layer 31, or may be provided to extend over the surface of the resin layer 31. Still further, the metal wires 32n and 32p may be covered by the resin layer 31 at the side surfaces in the lateral direction, which are not to be used as the mounting surface, so as not to be exposed. Moreover, the phosphor layer 2 does not have to be provided, and a light-transmissive resin layer may be provided instead of the phosphor layer 2. Also, the phosphor layer 2 may be provided on the lower surface side of the growth substrate 11 without removing the growth substrate 11.

Heretofore, the light emitting device according to the present disclosure and the manufacturing method thereof have been specifically described with reference to the embodiments, but the spirit of the present invention is not to be limited by these descriptions, and is to be interpreted in a broad sense based on the claims. Also, it is needless to say that various changes, modifications and the like based on these descriptions are also included within the spirit of the present invention.

According to the light emitting device of an embodiment of the present invention, the volume of metal inside a resin layer may be increased, and thus, the heat conductivity of a supporting member having the resin layer as the main body is increased, and as a result, the heat dissipation property of the light emitting device may be improved. Also, according to the manufacturing method of a light emitting device of an embodiment of the present invention, a light emitting device having the structure described above may be manufactured with high productivity by a simple process of forming internal wiring by wiring a metal wire so as to commonly connect the electrodes of semiconductor light emitting elements arranged in one direction and of performing singulation by cutting along a boundary line.

Obviously, numerous modifications and variations of the present invention are possible in light of the above teachings. It is therefore to be understood that within the scope of the appended claims, the invention may be practiced otherwise than as specifically described herein.

What is claimed is:

1. A manufacturing method of a light emitting device, comprising:
    preparing a wafer that is provided by arranging a plurality of semiconductor light emitting elements including semiconductor stacks and electrodes provided on first surfaces of the semiconductor stacks;
    wiring a metal wire in an arc shape between the electrodes of the plurality of semiconductor light emitting elements that are arranged in one direction on the wafer so as to connect each of the electrodes and the metal wire;
    providing a resin layer on a side of the first surfaces of the semiconductor stacks in such a way that the metal wire is accommodated inside the resin layer; and
    cutting the wafer along a boundary line to segment the plurality of semiconductor light emitting elements so as to singulate the plurality of semiconductor light emitting elements.

2. The manufacturing method according to claim 1, wherein in the wiring of the metal, the metal wire is wired in such a way as to connect the electrodes of the plurality of semiconductor light emitting elements that are arranged adjacent to each other in a direction, in a plan view, that is orthogonal to the one direction along which the metal wire is wired.

3. The manufacturing method according to claim 1, wherein in the cutting of the wafer, the metal wire is caused to be exposed from the resin layer by cutting the wafer along the boundary line.

4. The manufacturing method according to claim 1, further comprising:
    removing, in a region along the boundary line, the resin layer together with the metal wire that is accommodated inside the resin layer to cause the metal wire to be exposed from the resin layer after the providing of the resin layer.

5. The manufacturing method according to claim 1, wherein a shape of a transverse plane of the metal wire is a rectangle, and
    wherein the metal wire is wired in such a way that a long side of the rectangle is parallel to a plane that is perpendicular to a stacking direction.

6. The manufacturing method according to claim 1, wherein the metal wire comprises a material selected from Cu, Al, and alloys having Cu and Al.

7. The manufacturing method according to claim 6, wherein the metal wire comprises the material selected from Cu, Al, and alloys having Cu and Al as principal components.

8. The manufacturing method according to claim 1, further comprising:
    providing a metal layer whose film thickness is 3 μm or more and 50 μm or less within the resin layer as an uppermost layer of the electrodes.

9. The manufacturing method according to claim 8, wherein the metal wire and the electrodes are electrically connected by the metal wire being connected to an upper surface of the metal layer via the metal wire.

10. The manufacturing method according to claim 1, wherein an end surface of the metal wire that is exposed from the resin layer is covered by an external connection electrode.

11. The manufacturing method according to claim 1, further comprising:
    providing a wavelength conversion layer on a side of another surface of the semiconductor stacks.

12. The manufacturing method according to claim 11, wherein the wavelength conversion layer converts light of a wavelength emitted by the semiconductor light emitting elements into light of a different wavelength.

\* \* \* \* \*